United States Patent
Ono et al.

[11] Patent Number: 6,075,652
[45] Date of Patent: Jun. 13, 2000

[54] CONVEX-MICROGRANULAR SURFACE STRUCTURE

[75] Inventors: Kotaro Ono, Fukui; Kenji Sumida, Tochigi, both of Japan

[73] Assignee: Washi Kosan Co., Ltd., Tokyo, Japan

[21] Appl. No.: 08/732,482

[22] PCT Filed: Feb. 16, 1996

[86] PCT No.: PCT/JP96/00350

§ 371 Date: Nov. 6, 1996

§ 102(e) Date: Nov. 6, 1996

[87] PCT Pub. No.: WO96/25677

PCT Pub. Date: Aug. 22, 1996

[30] Foreign Application Priority Data

| Feb. 17, 1995 | [JP] | Japan | 7-029222 |
| Mar. 30, 1995 | [JP] | Japan | 7-072611 |
| May 17, 1995 | [JP] | Japan | 7-118545 |
| Aug. 31, 1995 | [JP] | Japan | 7-223516 |
| Feb. 8, 1996 | [JP] | Japan | 8-022350 |

[51] Int. Cl.[7] ............... G02B 3/00; G02B 3/08
[52] U.S. Cl. ........................... 359/642; 359/743
[58] Field of Search ........................ 359/642, 743

[56] References Cited

U.S. PATENT DOCUMENTS

| 4,153,654 | 5/1979 | Maffitt et al. | 264/1 |
| 5,189,337 | 2/1993 | Endo et al. | 313/479 |

FOREIGN PATENT DOCUMENTS

| 63075702 | 4/1988 | European Pat. Off. . |
| 660138A2 | 6/1995 | European Pat. Off. . |
| 660138A3 | 6/1995 | European Pat. Off. . |
| 3831503 | 3/1990 | Germany . |
| 63-75702 | 4/1988 | Japan . |
| 2-175601 | 7/1990 | Japan . |
| 4-122740 | 4/1992 | Japan . |
| 5-88001 | 4/1993 | Japan . |
| 5-288903 | 11/1993 | Japan . |
| 5-320387 | 12/1993 | Japan . |
| 6-45627 | 2/1994 | Japan . |

*Primary Examiner*—Georgia Epps
*Assistant Examiner*—Michael A Lucas
*Attorney, Agent, or Firm*—Jordan and Hamburg LLP

[57] ABSTRACT

The surface and/or interface of a lens or the like is formed with a convex-microgranular surface. For this purpose, a stamper 108 having a concave-micro-granular transfer-molding surface transfer-molded from a convex-microgranular surface comprised of $SiO_2$ or the like and varying continuously in the index of refraction is used to reproduce the convex-microgranular surface.

30 Claims, 21 Drawing Sheets

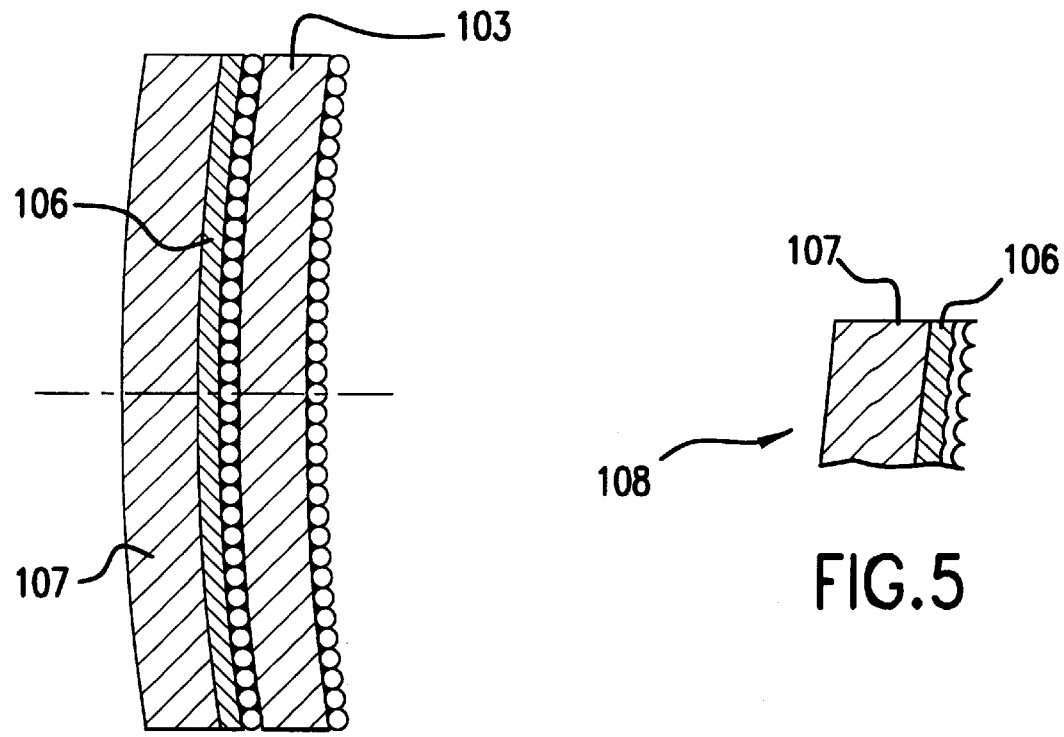
FIG. 4
FIG. 5
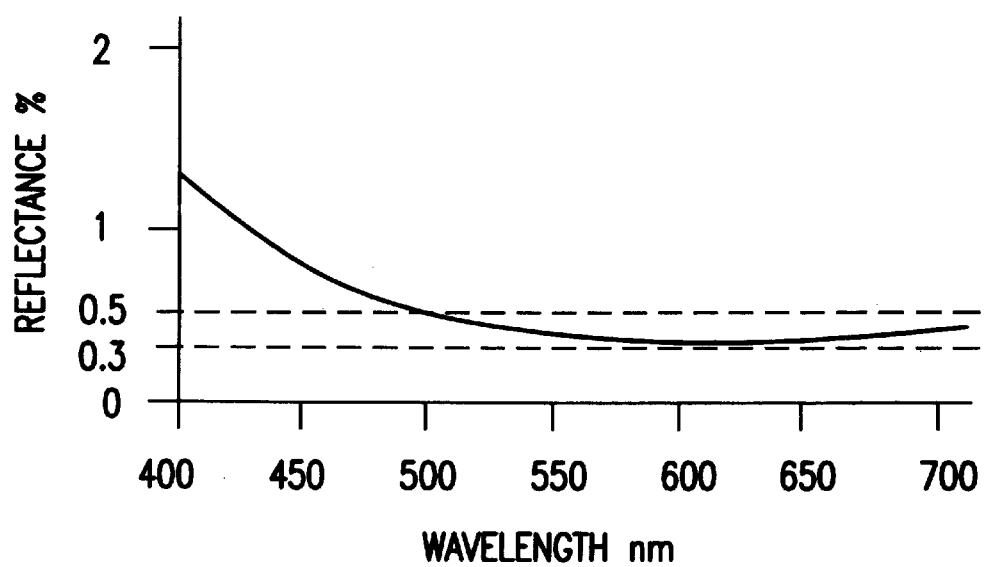
FIG. 6

REFRACTIVE INDEX
OF AIR          no=1.00

REFRACTIVE INDEX
OF GLASS        ng=1.53

REFRACTIVE INDEX $nf(x)=ng*V(x)+no(1-V(x))$

6,075,652

CONVEX-MICROGRANULAR SURFACE STRUCTURE

TECHNICAL FIELD

The present invention relates to a convex-micro-granular surface structure which is contributory to attenuation of reflectance and/or enhancement of light collection. In further aspects, the present invention relates to a plastic lens structure for spectacle use, a process for manufacturing the same, a solar cell including a mechanism for improving the light collection efficiency, a technology for preventing surface reflection on the readout side of an optomagnetic recording medium, a photosensitive material which is chiefly used as a photographic film or printing paper, the light-receiving surface of which is provided with an antireflective function, a method and apparatus for preventing reflection of light within an irradiation light path in the fabrication of an electronic circuit including optical means, and associated products, among others.

BACKGROUND TECHNOLOGY

In diverse industrial fields, attenuation of reflection and/or enhancement of light collection efficiency has been required and a number of relevant proposals have been made to this day.

By way of illustration, spectacles are required to possess the function of correction of vision, the function to protect the eye from foreign matter and unwanted light rays, and fashionableness. Moreover, constant demands exist for ever lighter and thinner lenses, while colored lenses are valued for their fashionableness. Under the circumstances and prompted by advances in the development of polymer materials having high refractive indices, high transparency, dyeability, etc., the demand for plastic lenses has by now surpassed the demand for glass lenses. The performance characteristics required of a plastic lens are high transparency, high refractive index, light dispersion, reduced weight, safety, dyeability, and moldability, among others. At the same time, decreases in the quantity of reflected light on the lens surface and increases in the transmissivity of the lens are also important parameters. Generally the reflected light on the surface of the lens on one side amounts to 3–4% and the tendency is that the larger the refractive index of a lens, the greater is the quantity of reflected light generated. The means employed today for reducing the quantity of reflected light consists in building up a plurality of thin metal films to extinguish reflected light through the mutual interference of reflected light rays among the layers and it is common practice to construct 3–7 antireflective layers. While this construction of antireflective layers is carried out using a vacuum vapor deposition equipment, a very large equipment is required for mass processing of lenses and this entails not only a high initial investment but also a high running cost both of which lead to appreciation of the lens cost.

The quantity of reflected light across the interface between a transparent, smooth-surfaced material and the air can be decreased by varying the mean index of refraction between said surface and air continuously. This objective can be accomplished by forming a heterogeneous layer on the surface of a transparent material. The principle of this heterogeneous anti-reflective technology is now discussed. Assuming, for instance, that the surface has irregularities such as those illustrated in FIG. 9, the refractive index $[nf(x)]$, where x represents the direction of depth of the surface layer, can be expressed by the following equation (1).

$$nf(x) = ng \cdot V(x) + n_o(1 - V(x)) \quad (1)$$

wherein ng represents the refractive index of glass, $V(x)$ represents the volume of glass down to the depth x, $n_0$ represents the refractive index of air. Here, at the interface between air and the film and the interface between the film and the glass substrate, there is a discontinuous change in refractive index as illustrated in FIG. 10. writing the refractive indices at these points as $n_1$ and $n_2$, respectively, the index of reflection R of this layer can be expressed by the following equation.

$$R = \frac{1 - 4n_0 n_1 ng}{(n_1 ng + n_0 n_2)^2 - \{(n_1^2 - n_0^2)(ng^2 - n_2^2)\sin^2 \delta_a\}/2} \quad (2)$$

$$\delta a = 2\pi(n_1 + n_2)X/\lambda$$

Assuming that, in this equation, $n_0=1.0$, $n_1=1.1$, $n_2=1.477$, $ng=1.53$, the lowest reflectance value is obtained when the surface irregularity value is 100 nm. However, it is quite difficult to form such microfine irregularities. To solve this problem, Japanese Kokai Patent Publication No. 2-175601 discloses a antireflective device and a method for its production, wherein ultrafine particles are immobilized in a filmy fashion directly on the surface of a transparent substrate to thereby satisfy both the requirements of low reflectance and high transmissivity. Here, ultrafine $SiO_2$ particles with a small particle size variation are disposed in a monolayer on a glass substrate for improved transmission and a remarkable antireflective effect.

Ultrafine $SiO_2$ particles can be immobilized in a monolayer on a glass substrate by the process which comprises dipping the glass substrate in a bath consisting of a solution containing ethyl silicate, ethanol, IPA, MEK, etc. as well as water and nitric acid for hydrolysis of ethyl silicate (S408, Asahi Glass Co.) and a 20 wt. % dispersion of $SiO_2$ particles with a diameter of 120 nm in ethanol, raising the glass substrate from the bath in a perpendicular direction at a rate of 0.98 mm per second, allowing the volatile matter to vaporize, and baking the treated glass substrate in the air at 150° C. for about 30 minutes to decompose the tetraethoxysilane. By this procedure, ultrafine particles of the decomposition product $SiO_2$ are securely immobilized in a continuous, uniform thin layer.

FIG. 11 is a schematic view showing ultrafine particles of $SiO_2$ as immobilized on a glass plate in the above manner. In the position indicated by the symbol A in the drawing, the refractive index is equal to the refractive index of air, no, which is taken as 1. In position B, the refractive index is equal to the refractive index of the ultrafine powder 4, i.e. n=1.48. The refractive index of the portion surrounded by these positions A and B can be calculated by means of the above equation (1) and the refractive indices in intermediate positions are considered to vary in proportion with the percentage of the volume occupied by $SiO_2$ in the total volume of the immaginary small plate shown in the drawing. Writing the refractive index in position C which is situated slightly inward of A (on the glass plate side) as $n_1$, the refractive index at B where the volume occupied by $SiO_2$ particles in said immaginary small plate accounts for approximately 100% as ng, and the refractive index in position D which is situated slightly outward of B as $n_2$, the conditions under which the surface reflectance R of the glass plate becomes minimal are given as follows.

$$R = \frac{(n_1 ng - n_2 n_0)^2}{(n_1 ng + n_2 n_0)^2} = 0$$

It is apparent that a non-reflective state is obtained when the condition of $ng-n_2/n_1$ is satisfied. Here, the value of $n_2/n_1$ is dependent on the shape of irregularities. Since $n_1$ and $n_2$ are values determined according to the percentage volume of $SiO_2$ within the immaginary plate, they might appear to be unrelated to the diameter of ultrafine particles but as experimentally demonstrated, production problems are encountered if the particle diameter is smaller than about 30 nm. Thus, if the particle diameter is too small, the irregularities are too much smoothened out to lose the ability to inhibit reflection of light. On the other hand, if the diameter is larger than about 300 nm, opacification takes place to reduce the degree of transparency. Therefore, as mentioned above, the optimum antireflective performance can be obtained when the thickness of said monolayer of ultrafine particles is approximately 100 nm.

There is no serious problem with the immobilization of $SiO_2$ in a monolayer on a glass substrate but when the same ultrafine particles are to be immobilized on a clear resin plate, a binder exhibiting strong adhesion to the common transparent substrate such as an acrylic board or a polycarbonate board is not available. No suitable binder is available, either, for lens and other optical materials such as CR-39 and urethane resin. Therefore, the present applicant attempted a direct transfer of a microgranular monolayer surface onto a transparent resin substrate for the formation of ultrafine irregularities on the resin surface and disclosed the result in Japanese Patent Application No. 5-330768.

The above technology was more or less satisfactory in that an original microgranular surface can be exactly transferred but when the transfer process was repeated, such troubles as dislodging of ultrafine particles, difficulty in mold release, and non-uniformity of the transfer surface occurred, so that the need for improvement was felt. However, if the quantity of the binder is increased to prevent dislodging of particles, the ultrafine particles tend to be embedded in the binder to detract from the function of achieving a continuous gradation of refractive index. Moreover, in order to insure an exact transfer of ultrafine particles for faithful reproduction of the radii of curvature of the particles, the quantity of the binder should be as small as possible. Regarding the difficulty in mold release, the resin finds its way into the intergrain spaces to form anchors which require a large releasing force and may cause breakage of the matrix. Therefore, a novel matrix free from such problems has been demanded.

The present invention has for its object to provide a lens with reduced surface reflectance as manufactured using a novel matrix improved in the above aspects for the transfer of a microgranular monolayer surface.

The present invention is further addressed to improvement of the light collection efficiency of solar cells.

Devices adapted to generate electricity in response to excitation by light have been utilized as sensors in illuminometers and for finder control in cameras, among other applications, and highly efficient optical transducers such as silicon semiconductors have appeared in recent years. As to such semiconductor materials, silicon monocrystals and polycrystals are generally employed and the demand for amorphous silicon, in particular, is rapidly growing because of its advantages in production methods and costs. Meanwhile, in the field of solar batteries, the absorption wave-length band varies with the physical properties of semiconductor materials constituting the solar cell. Thus, whereas crystalline silicon generally has a sensitivity peak in the infrared region from about 800 nm to about 1000 nm, amorphous silicon has a sensitivity peak in the visible region of the spectrum. Moreover, the light-receiving surface of a semiconductor material is metal-polished, the reflection of light is large, with reflected light accounting for about 35% of incident light. Therefore, it is common practice to deposit 2–3 thin metal layers on the surface by the vacuum vapor deposition technique so as to suppress the proportion of reflected light to less than 10%.

As to means for reducing the reflection of light, several methods are available in addition to the above method in which the VVD films are used for exploitation of interferences of light. Thus, the method comprising coating with a solution of some fluorine-containing low-refractive-index resin or a dispersion of a low-refractive-index substance such as $MgF_2$ so as to reduce the quantity of reflected light at the interface with air can be mentioned by way of example. In such methods, the reflection characteristics vary with the thickness of the coat and the layer structure but, as general trends, the characteristics shown in FIG. 23 are obtained. Thus, Curve R5 represents the reflection characteristic of the material coated with a solution of fluorine-containing low-refractive-index resin, indicating a reflectance of 0.8–1.0% around 550 nm and a reflectance of 2–3% for incident light with wave-lengths of 400 nm and 800 nm. When the monolayer film is composed of $MgF_2$ (refractive index 1.38), Curve R3 is obtained. In the case of $SiO_2$ (refractive index 1.46), Curve R2 and, in the absence of a layer, Curve R1 are respectively obtained. When a multi-layer film is used as in the case of a lens, the reflection characteristic of Curve R4 is obtained, indicating a lowest reflectance of 0.2% around 450 nm and 650 nm but about 1.5% at 500 nm. While the conventional antireflective layer is thus constructed by techniques suited to applications, it is desirable to provide a material which would show low refractive index constantly over the range of 400 nm to 800 nm. Moreover, the construction of a multi-layer film by the vacuum vapor deposition technique requires costly equipment and is time-consuming, thus leading to high production cost.

When light passes through a substance, it is partially reflected by the surface of the substance. To prevent this reflection, there is a method in which the refractive indices of two adjoining substances are varied continuously. This method comprises immobilizing ultrafine particles with a diameter of 30 nm–600 nm in a single parallel array and the standard procedure is disclosed in Japanese Kokai Patent Publication No. 2-175601. Moreover, the present applicant proposed a technique for providing a transparent member with an antireflective function which comprises transferring a surface constituted of ultrafine particles to the transparent member in Japanese Patent Application No. 5-330768 and, as a typical application of the technique, disclosed a case of application to the CD in Japanese Patent Application No. 7-29222.

It is an object of the present invention to apply the above technology to enhancement of the light collection efficiency and expansion of the light-receiving area of a solar cell.

It is a further object of the invention to prevent the surface reflection of an optomagnetic recording medium.

The optomagnetic recording medium is generally available in the form of a disk which is easily stowable. Therefore, the optomagnetic recording medium is commonly known as an optical disk, and according to uses, is classified into a read-only disk, a writable disk, a rewritable disk, and so on. Data are transcribed or written on the recording surface of the medium and the record is read out with laser light for reproduction.

Unlike solar light, the laser light used for writing and reading of information on an optomagnetic recording medium is a light of a single wavelength band and no mass with good linearity and high collection efficiency. The wavelength of laser light varies with different light sources but for optomagnetic recording and playback, laser light within the wavelength range of 633–830 nm is frequently employed. The wavelengths of such laser emissions are close to the upper limit of the visible region of the spectrum.

When a laser light passes through a transparent body, it is refracted according to the refractive index of the particular transparent body, while it is reflected by a mirror surface. An optical recording medium records signals according to the lengths of pits and the depth of the pits is usually set to about 0.1 $\mu$m. In the readout of signals, the laser light spot is projected to the pit and surrounding area. By utilizing the phenomenon that the quantity of reflected light from the pit is decreased by the interference of reflected light rays due to the difference in the light path, the presence or absence of such reflected light rays and the length of the pit are converted to a digital signal.

It is not true that when a laser light is incident on a transparent body, all the laser light passes through the transparent body but rather a portion of the light is reflected by its surface. The reflectance can be calculated on the basis of the intrinsic refractive index of the very substance by means of the equation of Fresnel.

$$R=\{(ng-n_o)/(ng+n_o)\}^2$$

The reflectance values of polycarbonate and acrylic resins, which are generally used for optical disks, as calculated by the above equation are 5.2% and 3.9%, respectively, for one side. In the optical disks used today, the transparent members are not provided with means for preventing surface reflectance. In the above equation, ng represents the refractive index of the substrate material and no represents the refractive index of air.

For the purpose of decreasing the surface reflectance of a transparent member located on the readout side of an optical disk, the method utilizing the interference of light, for example the procedure which comprises forming a thin film of metal by vacuum vapor deposition for exploiting the interference of light, is not suitable. Thus, the method which comprises varying the refractive index continuously to decrease reflected light is more advantageous in that the phase of light is not disturbed.

In view of this fact, an object of this invention is to provide a system in which a layer varying continuously in refractive index is disposed on the readout side to attenuate reflection.

It is another object of the present invention to provide a photosensitive material having an antireflective function.

In regard of information recording, the technique of digital recording with the use of magnetism or laser light is meeting the contemporary needs because of its instancy. However, photography which provides picture images with greater certainty in an analog fashion is still assuming a solid position. As a recording medium, photography uses a photosensitive material which can be prepared by dispersing crystal grains of a silver halide, which is a photosensitive substance in an aqueous solution of gelatin, coating the resulting photographic emulsion in a thickness of about 10–30 $\mu$m on a plastic film or a sheet of glass or paper, and drying the coat. The coating amount of silver halide in this photosensitive material is about 1 mg/cm$^2$. The silver halide may for example be silver bromide, silver chloride or silver iodide.

A schematic cross-section view of a negative film for general photography using a plastic film as a support, which is an example of said photosensitive material, is presented in FIG. 44. The reference numeral 430 represents a protective layer which protects the emulsion grains from mechanical injuries associated with scratching or abrasion. The thickness of the protective layer is limited to about 1 $\mu$m. The reference numeral 431 represents a photographic emulsion layer which comprises a dispersion of crystal grains of a silver halide in an aqueous solution of gelatin and its dry thickness is usually about 15–25 $\mu$m. Indicated at 432 is a support which may be a plastic film such as polyethylene terephthalate film or cellulose triacetate film. Though it varies with different uses, the thickness of the emulsion layer is 85–200 $\mu$m. The reference numeral 433 represents a backing layer which is a hard gelatin layer more or less as flexible as the photographic emulsion layer 431. The function of this backing layer is to prevent curling of the photosensitive material.

Another example of the photosensitive material is a sensitive paper (photographic printing paper). FIG. 45 is a schematic cross-section view of the sensitive paper. The reference numeral 434 represents a protective layer predominantly made of gelatin, the thickness of which is about 1 $\mu$m. The reference numeral 435 represents an emulsion layer, which comprises a dispersion of crystal grains of a silver halide in an aqueous solution of gelatin. The thickness of this layer is fairly thick, i.e. 5–12 $\mu$m. The reference numeral 436 represents a paper support. This support 436 is sturdy enough to resist the alkaline developer and acidic fixative and withstand prolonged water rinsing, and its thickness is about 0.04–0.3 mm and is usually classified into the thick, medium, and thin grades. A baryta layer 437 is disposed on one side of the support 436. This baryta layer 437 is a layer formed from a mixture of barium sulfate crystals and gelatin on the paper stock for increasing the reflectance and gloss of paper and preventing the emulsion from seeping into the fibrous layer of paper.

As described above, the surface layer of a photo-sensitive material is protected with a thin film made predominantly of gelatin. Since exposure light of necessity passes through this protective layer, reflected light is generated at the interface with air to reduce the quantity of transmitted light. As a general procedure for reducing this reflected light, the above-mentioned technique comprising vapor-deposition of a metal in multiple layers is available. However, in the case of a photosensitive material, chemicals should diffuse through the gelatin layer and, therefore, a metal film is not suited. As mentioned hereinbefore, there also is a method which comprises varying the index of refraction continuously to reduce the reflection of light at the interface with air. Thus, in this method, ultrafine particles (particle diameters 30–600 nm) of SiO$_2$ are immobilized in a single parallel array. This technique can be basically applied to the surface of a photosensitive material but the immobilization of particles calls for a certain degree of bond strength and any adhesive of the gelatin series cannot satisfy this bond strength requirement. Moreover, other kinds of adhesives may detract from the diffusion of chemicals through the gelatin layer.

Accomplished with the above facts taken into consideration, the present invention has as a further object to provide a photographic light-sensitive material equipped with an antireflective function and yet fully retaining the properties of gelatin constituting the protective layer of the light-sensitive material.

The present invention is further directed to a method for preventing the reflection of irradiation light in the light path in the fabrication of an electronic circuit, to an associated apparatus, and to associated products.

For focussing an image pattern of an electronic circuit on a photoresist in the manufacture of an IC or LSI, there are available a variety of methods for light exposure, such as contact, close-up, life-size, and reduction methods. The fundamental principle of such methods comprises irradiating a photomask having a pattern based on a circuit design with light from a light source and focussing the pattern on a photoresist through a predetermined optical system. While the interposition of a pattern creates areas allowing the passage of exposure light and shielded areas, the transmitted light is preferably a beam of parallel rays not containing interference light and diffracted light. For this reason, a film or a quartz glass sheet is used as the substrate of a photomask but at least 4% of exposure light is reflected at the interface with air so that the quantity of transmitted light is as much decreased. In addition, when transmitted light passes through different substances, reflected light is scattered in random directions to create interference light. Therefore, an antireflective layer is required at least between the transparent support and the light-shielding layer for the formation of a pattern.

It is a further object of the present invention to provide an expedient method and apparatus for imparting an antireflective function to a light-transparent material such as a photomask or the interface of substances constituting a laminate such as a photo-resist in the fabrication of an electronic circuit by optical means.

DISCLOSURE OF THE INVENTION

In the present invention, for the purpose of reducing the reflection of light and/or improving the collection of light, a concave-microgranular surface is prepared by transferring a convex-microgranular surface varying continuously in the index of refraction as formed by particles of $SiO_2$, for instance, and using a stamper having said concave-microgranular surface as a transfer surface (a matrix), reproducing the convex-microgranular surface. Moreover, by using the thus-formed convex-microgranular surface as a transfer surface, a further concave-microgranular surface can be produced.

The term "convex-microgranular surface" means a surface carrying a series of substantially semi-spherical projections, that is to say a surface available upon immobilization of generally spherical ultrafine particles on the surface of a support with the aid of a binder, regardless of the kind of support. The shape of the support surface is not restricted, either, but may be a flat surface, a curved surface or even a surface having irregularities or steps or lands. The term "concave-microgranular surface" further means a surface having the shape formed by transfer of the above-mentioned convex-microgranular surface.

In the spectacle lens of the present invention, the object of reducing the reflection of light is accomplished by providing at least one of the face side, reverse side, or interface with a convex- and/or concave-microgranular surface with a radius of curvature in the range of 15–150 nm. The formation of said concave- and/or convex-microgranular surface is achieved by the transfer molding method using the above-mentioned stamper.

In the solar cell of the present invention, the object of improving the efficiency of light collection is accomplished by providing at least a portion of its light collection mechanism with the surface formed by the transfer technique using a microgranular surface varying continuously in the index of refraction as formed from particles of $SiO_2$ or the like as a first matrix (transfer surface).

As an alternative, the surface formed by using the surface copied using a matrix microgranular surface varying continuously in the index of refraction as a second or subsequent matrix may be included in said light collection mechanism.

For accomplishing the above-mentioned object of preventing surface reflection of an optomagnetic recording material, the present invention provides a substrate carrying information to be read with an incident and/or reflected beam of a laser light, in at least a part thereof, with a layer of ultrafine particles varying continuously in the index of refraction for enhancing the efficiency of arrival of a laser light corresponding to the wavelength of said incident and/or reflected light to the record surface and the efficiency of arrival of reflected light from the record surface.

Furthermore, using a microgranular surface as a matrix, a layer copying the configuration of the layer is produced. The rate of arrival of light can be enhanced by filling the microfine recesses of the copy with a substance having a refractive index smaller than the refractive index of the substance defining said recesses.

In addition, using the surface copied from said microgranular surface as a matrix, ultrafine semi-spherical projections can be produced for achieving a continuous gradation of the index of refraction.

In another aspect of the present invention, which is concerned with the prevention of reflection in a photosensitive material, a surface copied by the transfer technique using a microgranular surface varying continuously in the index of refraction as formed from $SiO_2$ or the like material as a first matrix is formed on at least one interface of light-transmitting substance layers.

As an alternative, a surface copied from a second or subsequent matrix obtained by using a microgranular surface varying continuously in the index of refraction as a first matrix is formed on at least one interface of light-transmitting substance layers.

As applied to the fabrication of an integrated circuit by optical means, the present invention comprises forming microgranular irregularities capable of producing a continuous change in the index of refraction in the depth of 15–150 nm by transfer molding on a laminated surface such as a thin film constituting a substrate surface or a photoresist and/or at least one surface of a light-transmitting member, such as a mask or a lens, in a light path between a light source and said laminate surface to thereby decrease the reflection of irradiation light and transmitted light on said laminate surface or said light-transmitting member.

Furthermore, the present invention comprises forming microgranular surface with irregularities capable of varying the index of refraction in a continuous fashion in the depth of 15–150 nm by the projection exposure technique.

In addition, using the above technology, the present invention provides an exposure system for the fabrication of an integrated circuit, e.g. IC or LSI, an integrated circuit as fabricated by using said exposure system, and a chip as fabricated using said integrated circuit.

Since the pattern of the resist layer that can be obtained by using the above-mentioned exposure system features a minimum of coving, chips with a high degree of integration can be provided.

BRIEF DESCRIPTION OF THE DRAWINGS

FIG. 4 is a cross-section view showing the process of fabrication of a stamper.

FIG. 5 is a partial cross-section view showing the stamper on exaggerated scale.

FIG. 6 is a diagrammatic representation of the reflectance obtained by the invention.

BEST MODE OF PRACTICING THE INVENTION

Figure 1:
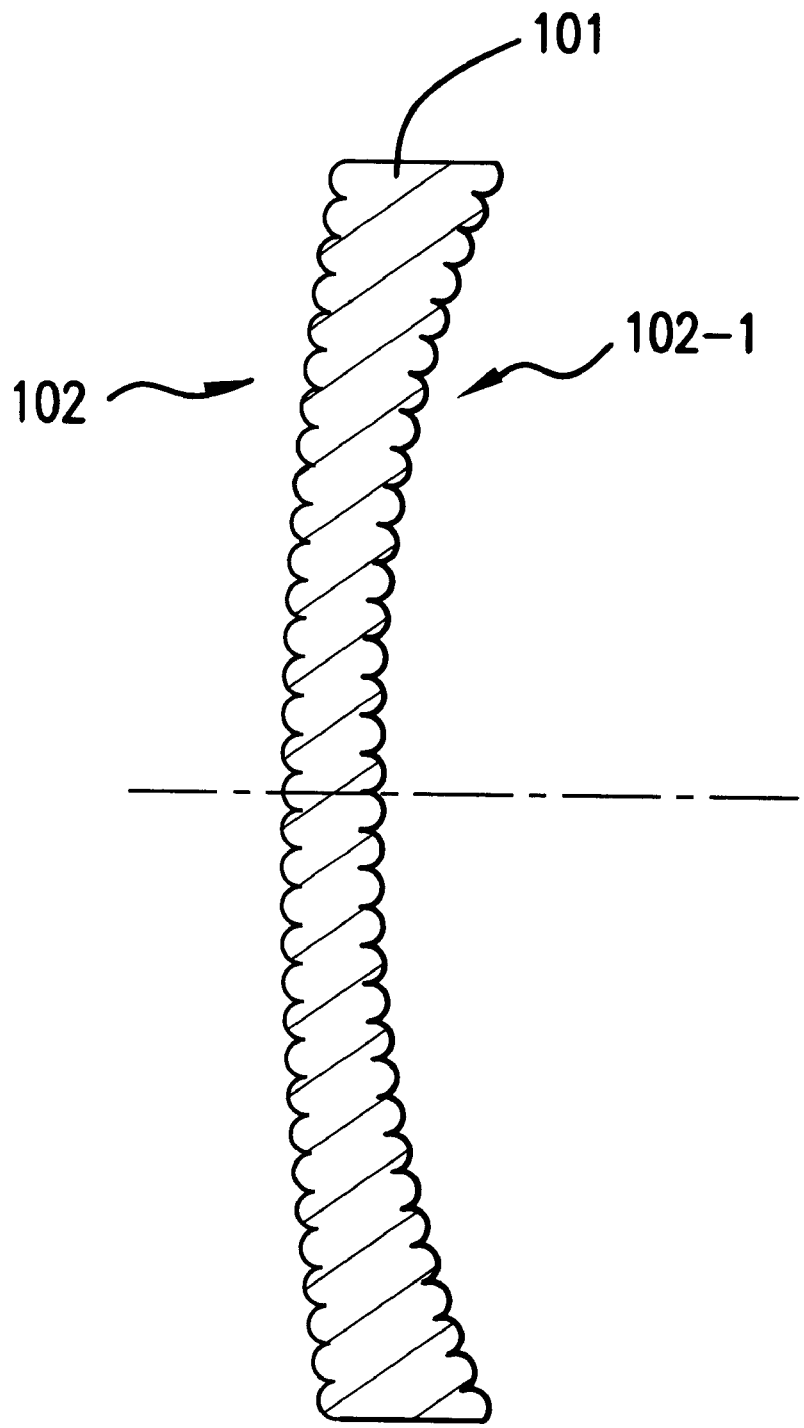
FIG. 1 is a sectional elevation view of the lens according to the invention.
Figure 2:
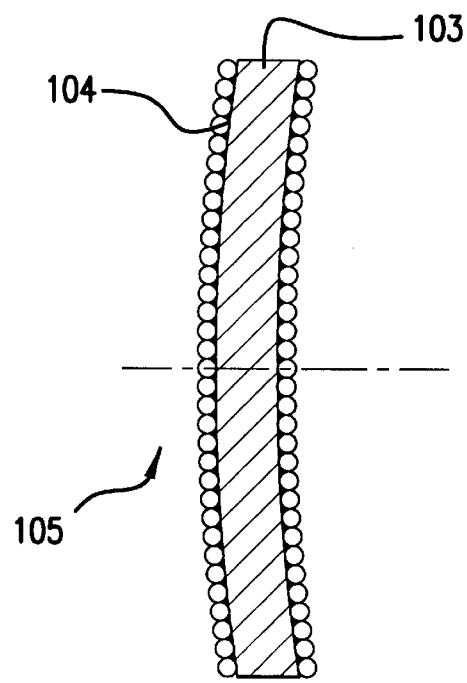
FIG. 2 is a view showing a glass mold used in the practice of the invention.
Figure 3:
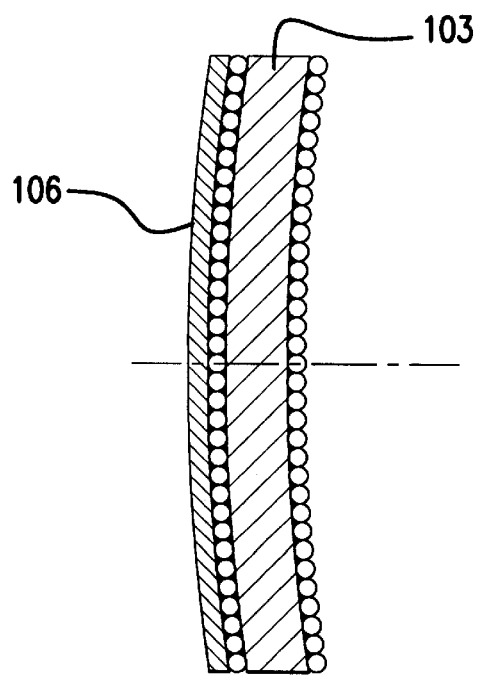
FIG. 3 is a cross-section view of the glass mold provided with a plating layer.

Referring to FIG. 1 which is a schematic cross-section view of a spectacle lens having microgranular surfaces formed by the transfer technique, the reference numeral 101 represents a lens body and the numeral 102 represents a transferred convex microgranular monolayer surface. FIG. 2 shows a cast polymerization glass mold 103 to which ultrafine $SiO_2$ particles with a diameter of 120 nm have been firmly secured.

For the formation of the lens 101 shown in FIG. 1, the microgranular surface 105 on the convex side (FIG. 2) is cleaned thoroughly and a nickel VVD and a nickel plating are carried out in that order, followed by rotation of the mold in the plating bath so as to even out the thickness of the nickel plate. When the nickel plate 106 has been adjusted to a predetermined thickness, the mold is taken out from the plating bath, rinsed, and dried. Then, a mold 107 having the same radius of curvature as that of the nickel plate layer 106 is bonded (FIG. 4). The assembly is subjected to a force as great as to separate the molds 107 and 103 from each other to cause the separation between the VVD layer and the microgranular surface. A partial cross-section view showing the separated mold 107 on exaggerated scale is presented in FIG. 5. Using the thus-obtained mold 107-nickel plating layer as a stamper 108, a cast polymerization reaction is carried out in the per se known manner to provide the lens 1 having convex microgranular convex and concave surfaces 102 as shown in FIG. 1. It is also possible to prepare a second stamper by transferring the nickel plate transfer surface, of course, the convex and concave surfaces are reversed in this case.

Using a high-refractive-index polyurethane resin with a refractive index of 1.66 as the lens molding resin, a spectacle minus lens as shown in FIG. 1 was molded and the reflectance of one side of the lens was measured. The reflectance curve thus obtained is shown in FIG. 6. The lens shows a reflectance of about 0.3% in the wavelength band of about 500 nm–550 nm where the eye perceives light with the greatest intensity and whereas the reflectance of the metal VVD layer is increased in this wavelength band, the reflectance is generally flat in the visible region of the spectrum. The color of reflected light on the object side of the lens obtained in this embodiment is purple. Although the particles used in this embodiment has a diameter of 120 nm, any particle diameter within the range of 30–300 nm can be selectively used so as to modify the reflection characteristics.

Figure 7:
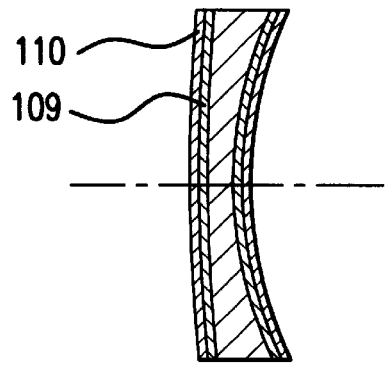
FIG. 7 is a cross-section view showing a process according to the invention.
Figure 8:
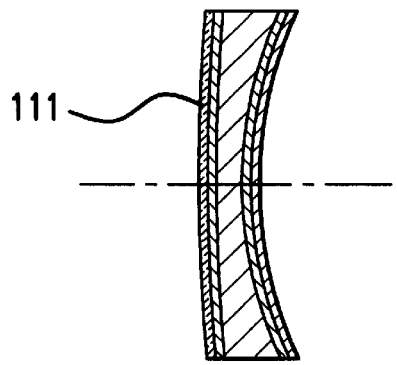
FIG. 8 is a sectional elevation view of a lens formed with a convex-microgranular surface on its hard coat layer.
Figure 9:
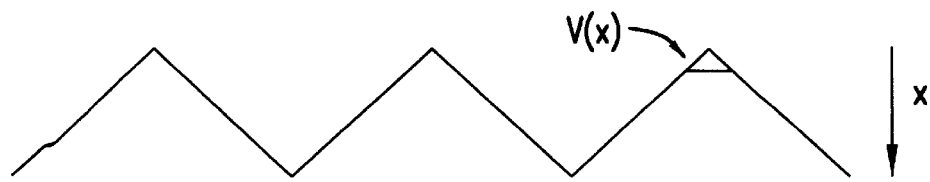
FIG. 9 is a diagram illustrating the principle of preventing reflection according to the invention.
Figure 10:
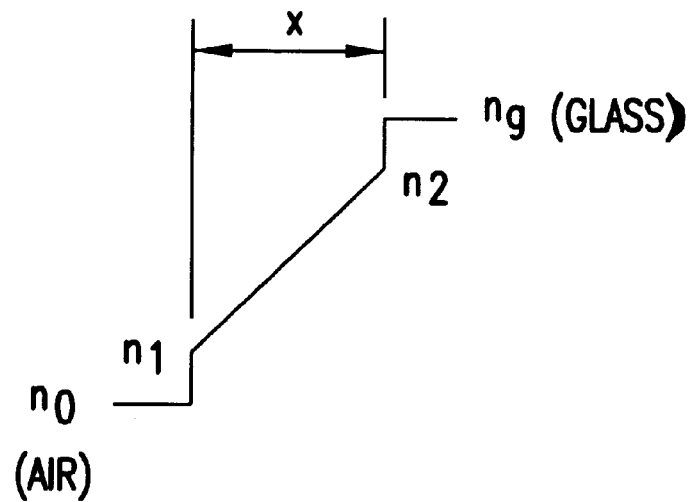
FIG. 10 is a diagram illustrating the mode of change in the index of refraction.
Figure 11:
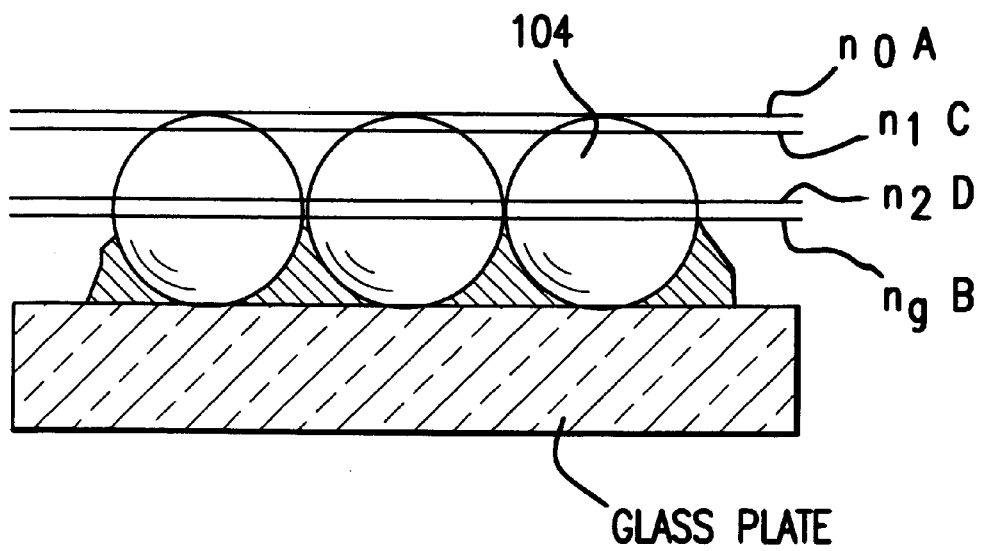
FIG. 11 is a diagram illustrating the schema for a continuous change in the index of refraction in accordance with the invention.

To improve the scratch resistance of said convex/concave microgranular surface, a silicone hard coating can be applied but such a practice would smoothen out the convex/concave surface, thus interferring with the continuous change of refractive index. This problem can be obviated as follows. First, the lens 101 shown in FIG. 1 is molded by using the conventional mold and an adhesive layer 109 for improved adhesion is formed on its surface as shown in FIG. 7. Then, a silicone hard coat 110 is constructed in a thickness of 1–1.5 $\mu$m and pressed with the stamper 108. This operation should be carried out in a vacuum chamber, for otherwise the air in the microfine irregularities of the stamper will be entrapped to prevent formation of a uniform transferred surface. While this procedure complicates the process, the operation can be simplified by applying a hard coating to the stamper and pressing the stamper against said adhesive layer 109 to squeeze out the surplus hard coating. With the stamper pressed against it, the coating is dried under heating and, then, the stamper is removed to provide a scratch-resistant microgranular surface 111 (FIG. 8).

The hard coating layer applied by this technique is effective in scattering the reflected light formed at the interface between the adhesive layer and the lens. Moreover, the reflected light can be further decreased by depositing $MgF_2$ with a refractive index of 1.38 in a single layer on the surface of said hard coating layer by the vacuum vapor deposition technique.

A solar cell as an embodiment of the present invention is now described.

Figure 12:
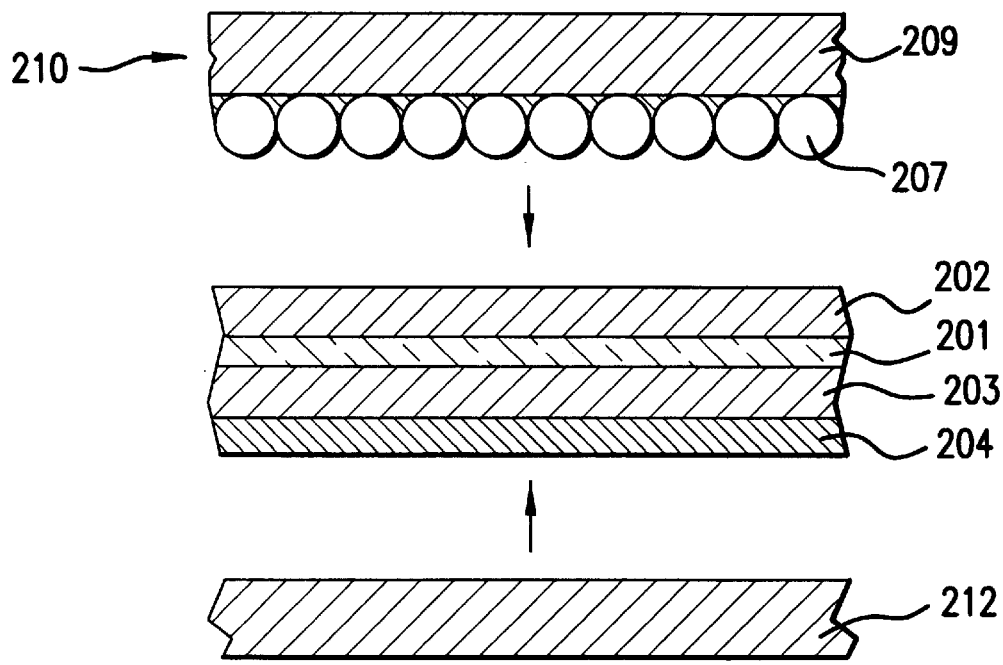
FIG. 12 is a schematic cross-section view showing the process of fabrication of a solar cell as an embodiment of the invention.

FIG. 12 is a schematic cross-section view showing the process for fabrication of a solar cell embodying the principle of the invention. The reference numeral 201 represents a solar cell. The numerals 202 and 203 represent transparent resin members and the reference numeral 204 represents a substrate. Prior to describing this embodiment, a process for fabricating a matrix is described and the reason why the microgranular surface is conducive to a continuous change in the index of refraction is explained.

Figure 13:
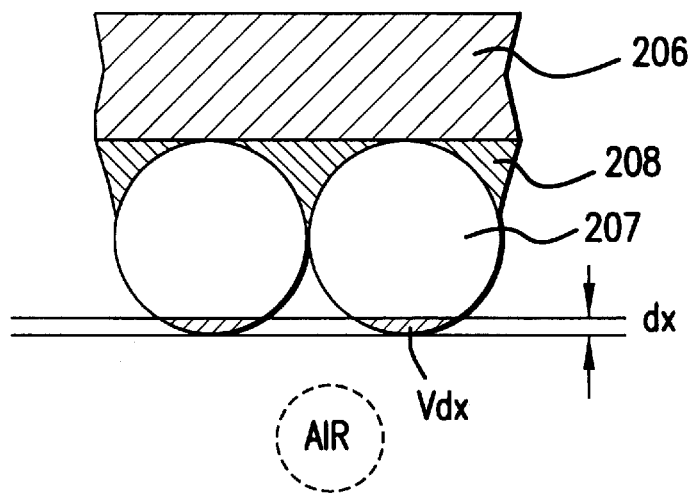
FIG. 13 is a cross-section view showing a matrix on exaggerated scale.

Referring to FIG. 13, the reference numeral 206 represents a glass plate as the transparent member, the reference numeral 207 represents ultrafine particles of $SiO_2$, and the reference numeral 208 represents a binder. The mean refractive index Ndx at the micro-depth dx in an arbitrary position from the air side toward the glass plate is defined by the following equation:

$$Ndx = Ng \cdot Vdx + No (1 - Vdx)$$

wherein No represents the refractive index of air, Ng represents the refractive index of the particle, and Vdx represents the volume of the particle.

Therefore, the refractive index of the binder 208 for immobilizing the ultrafine $SiO_2$ particles 207 is preferably equal or close to the refractive index of the glass sheet 206. In this manner, the refractive index can be successively changed in the course from the refractive index of air, i.e. 1, to that of the glass plate 206.

Referring to FIG. 13, theoretically the diameter of particles may be large but as demonstrated experimentally, irregular reflection is prominent when the particle diameter exceeds about 600 nm, while the surface becomes flattened to produce an increased amount of reflected light when the particle diameter is not larger than 10 nm. The experiment performed using microfine particles having different diameters at intervals of 50 nm within the range of 10 nm to 600 nm revealed that particle diameters within the range of 50 nm to 200 nm are suitable. A typical production process is now described in detail.

Figure 14:
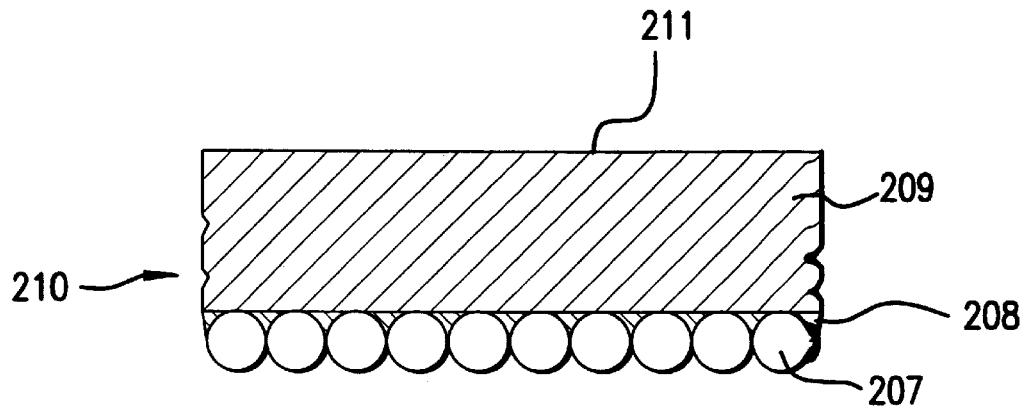
FIG. 14 is a sectional elevation view of a matrix used for measurement of reflection characteristics.

For the fabrication of a first matrix, an optical glass disk 209 with a diameter of 10 cm and a thickness of 5 mm (FIG. 14) is prepared, rinsed with pure water, and dried. A dipping bath is prepared by blending a mixture of ethyl silicate, ethanol, IPA, MEK, etc. with water and nitric acid for hydrolysis of the ethyl silicate (S408, Asahi Glass) with a 20 wt. % dispersion of $SiO_2$ with a diameter of 80 nm in ethanol. First, one side of the glass disk 209 is masked and the disk is then dipped into the dipping bath and raised out in a perpendicular direction at a rate of 0.98 mm/second. After the volatile fraction has been evaporated off, the mask is removed and the disk is heated at 300° C. for one hour.

Figure 15:
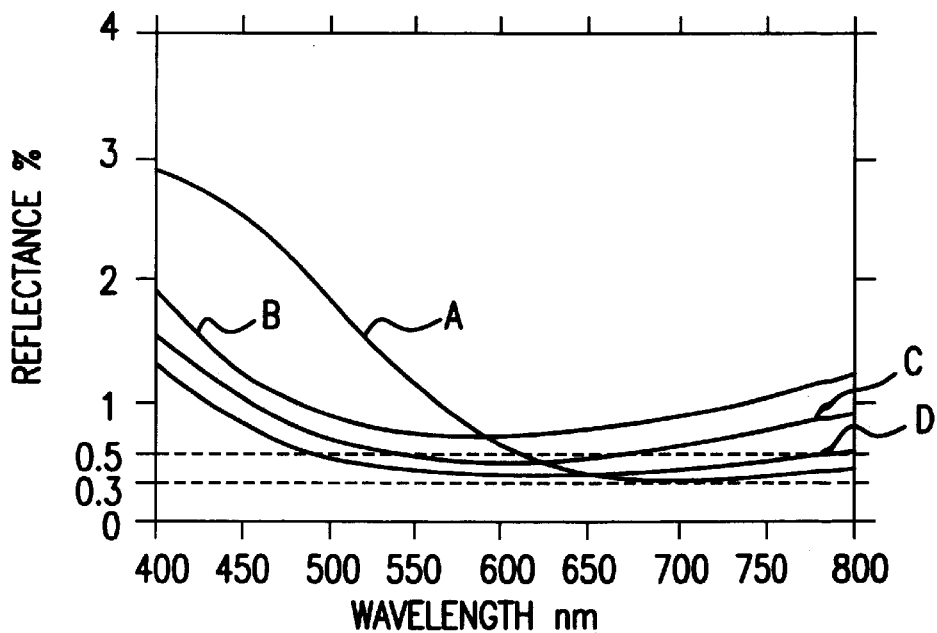
FIG. 15 shows the reflection characteristic curves on the side coated with ultrafine particles.

After cooling to room temperature, the disk 209 is subjected to ultrasonic cleaning to provide a first matrix 210. One side of the matrix is covered with a black coating 211 to prepare a light-absorbing surface and the reflection characteristic of the matrix is determined. The reflection characteristic of the side coated with ultrafine particles is represented by Curve A in FIG. 15.

Figure 16:
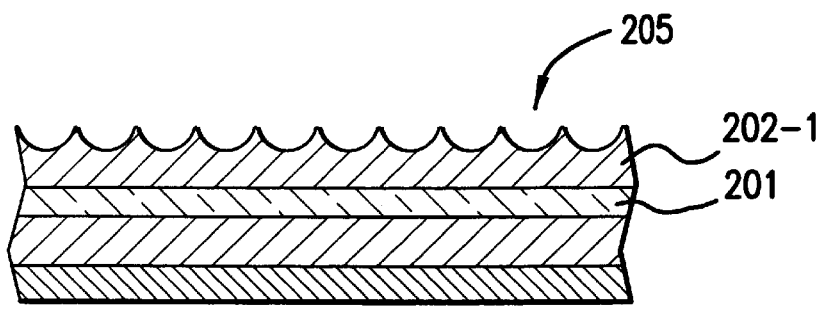
FIG. 16 is a schematic cross-section view of a solar cell after release of the laminate.
Figure 17:
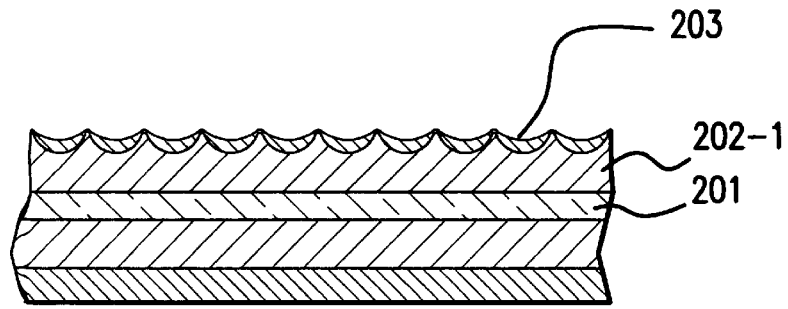
FIG. 17 is a schematic cross-section view of the solar cell shown in FIG. 16 as laminated with a fluorine-containing resin.

Then, the step of forming an antireflective layer in a solar cell using $SiO_2$ ultrafine particles with a diameter of 100 nm for said first matrix 210 is now described. As shown in FIG. 12, the solar cell structure of this embodiment comprising a solar cell 201, transparent resin sealants 202, 203, and a substrate 204 is a solar cell module of the subplate type. Here, EVA (ethylene vinyl acetate) is used as the transparent resin. In the light collection mechanism shown in FIG. 12, FRP is used as substrate 204 and a transparent EVA resin member (hereinafter referred to briefly as EVA) 203, solar cell 201, and transparent EVA resin member (hereinafter referred to as EVA) 202 are laminated in the order mentioned. On top of the laminate is placed the matrix 210, while a glass plate 212 is positioned as the bottom member, and the whole assembly is clamped with clip means. The clamped assembly is set in a vacuum heating laminator and heated at 80° C. When all the members have attained a uniform temperature, the assembly is taken out of the laminator and allowed to stand and cool to room temperature. The clip is removed and the matrix 210 is released. A schematic cross-section view of the laminate after release of the matrix 210 is presented in FIG. 16. The top surface of EVA 202 comprises an EVA 202-1 surface corresponding to the surface of said matrix 210. A molding surface 205 has recesses each representing a hemisphere with a radius of 50 nm and this surface also has an antireflective function giving a reflectance represented by Curve B in FIG. 15. Furthermore, as shown in FIG. 17, a coating layer 213 is superimposed by dipping the above solar cell module in a 30% dilution of a fluorine series coating agent (Fluorad FC-722, Sumitomo-3M) in the solvent Fluorinert (ditto). The refractive index of this coating layer is as low as 1.36 and has a reflection characteristic represented by Curve C in FIG. 15.

A second example of the solar cell according to the present invention is now described.

Figure 18:
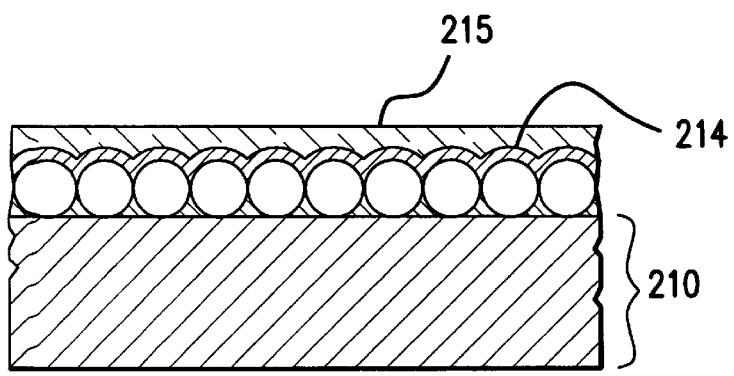
FIG. 18 is a schematic cross-section view of the matrix obtained by applying a VVD nickel layer and a plating layer to a first matrix.
Figure 19:
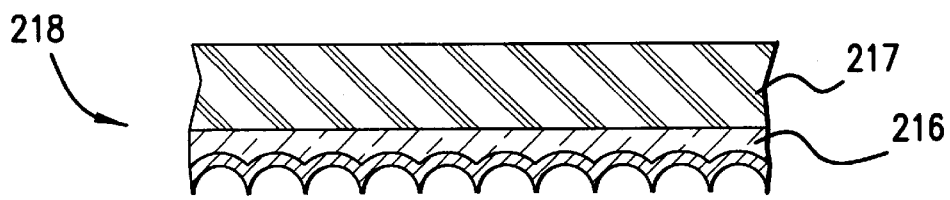
FIG. 19 is a schematic sectional elevation view of the stamper available upon removal of the plating layer from the matrix.
Figure 20:
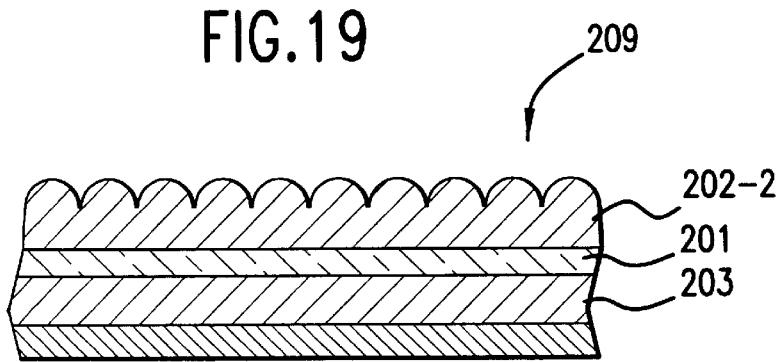
FIG. 20 is a sectional elevation view of a solar cell module fabricated by using the matrix shown in FIG. 19.

This example pertains to the use of a second matrix. Referring to FIG. 18, the first matrix 210 is first subjected to ultrasonic cleaning and a nickel layer 214 is then formed thereon by the vacuum vapor deposition technique. Then, using this VVD layer as an electrode, nickel plating is carried out to form a nickel plating layer 215. This process is similar to the process for production of an optical disk matrix. Referring to FIG. 19, this plating layer 215 is removed to provide a stamper 216. A nickel alloy plate 217 polished mirror-smooth for approximation of linear expansion coefficient is bonded to the above stamper 216 to provide a second matrix 218. Using this matrix 218, a solar cell module is constructed in the same manner as the first example. The cross-section of this module is shown in FIG. 20. Disposed on top of EVA 202 is an EVA 202-2 surface having projections 219 each representing a hemisphere with a radius of 50 nm. The fact that the refractive index of EVA which is 1.52 is larger than the refractive index of $SiO_2$ which is 1.46 might suggest that the reflectance of the module is greater but actually since the index of refraction of the layer varies continuously, the module shows a reflection characteristic represented by Curve D in FIG. 15. Compared with the above-mentioned method in which ultrafine particles of $SiO_2$ are immobilized on a glass substrate, this construction is advantageous in that it involves a reduced number of reflective interfaces because the same substance forms layers showing a continuous variation of refractive index.

A third example of the solar cell is now described.

Figure 21:
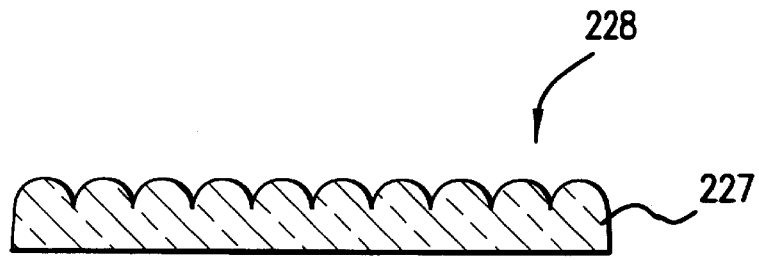
FIG. 21 is a sectional view of a film having a microgranular irregular surface.
Figure 22:
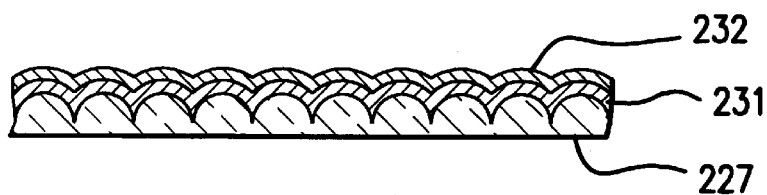
FIG. 22 is a sectional view of the film obtained by disposing a P-N junction layer on the film shown in FIG. 21.
Figure 23:
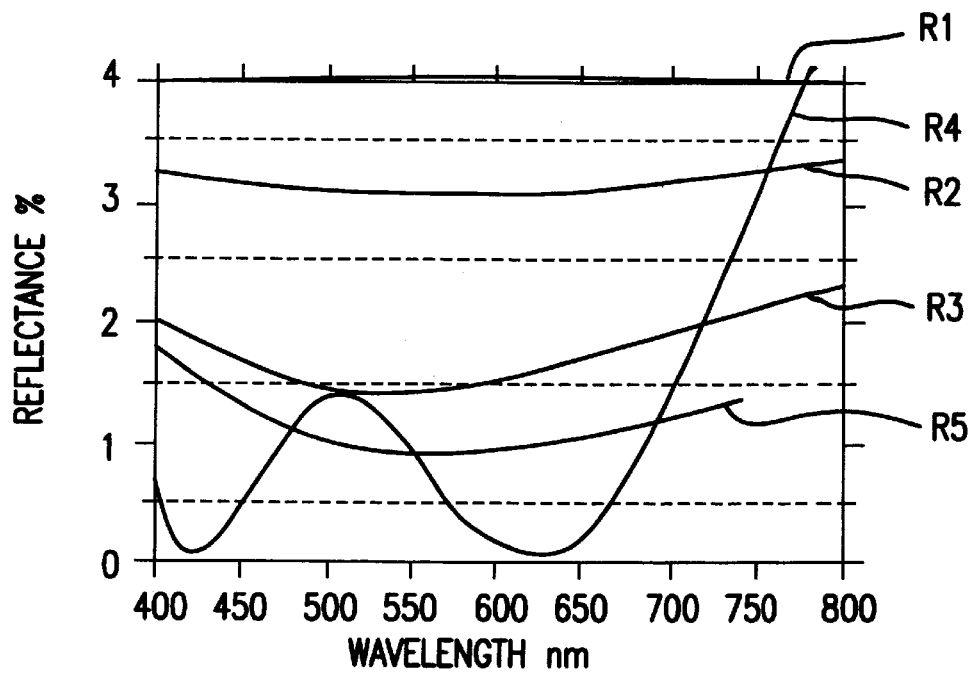
FIG. 23 shows reflection characteristic curves representing the relation between wavelength and reflectance.

This examples pertains to the formation of micro-fine irregularities on the substrate side. A fluorine-containing polymer (e.g. polytetrafluoroethylene) film is heated to about 330° C. and pressed against a matrix 218. Upon cooling, there is obtained a film 227 having the sectional configuration illustrated in FIG. 21. The surface of this film has projections 228 each corresponding to a hemisphere with a radius of 50 nm. When this film 227 is used as the substrate of an amorphous silicon solar cell, the following advantages can be obtained. Referring to FIG. 22, a P-N junction layer is formed on said fluorine-containing polymer film 227 by vapor deposition of a P layer 231 as a first layer and an N layer 232 as a second layer. Since the P-N junction layer forming a micro-spherical surface has a light-receiving area expanded to 1.6–1.7 times the area of a flat surface, a solar cell module with a high current value can be obtained. The heat-resistant film that can be used includes not only the above film but also cellulose triacetate film and polyimide film, among others. In the case where a second matrix is prepared, not only $SiO_2$ particles but also $ZrO_2$, $TiO_2$, and other powders can be employed. However, the shape of particles is preferably spherical. Since microfine irregularities can be produced in not only the above-mentioned heat-resistant film but also other film by utilizing said matrix 201 or 202, an antireflective function can be expediently imparted by bonding such film to the surface requiring prevention of reflection.

The technology of immobilizing microfine particles in a single layer for the preparation of a prototype matrix utilizes the coherent property of particles and, as such, the technology can be applied not only to particles within the diameter range of 50–600 nm but also to microfine particles with a diameter of about 1 $\mu$m. In this sense, the above-mentioned particle diameter of 100 nm is not an exclusive choice for the substrate of an amorphous silicon solar cell. Further, since the repeated use of the matrix 201 is undesirable in terms of mold releasability and the particle immobilization bond strength, it is advantageous to prepare a stamper by transferring the positive micro-granular surface 228 shown in FIG. 21 and fabricate a more sturdy third matrix.

The method of forming a microgranular surface on a resin surface by the transfer technique has been described. However, the substrate for transfer molding is not limited to resin but can be a ceramic surface or even a glaze and the technology of utilizing a micro-granular surface obtained by immobilizing microfine particles in a single layer on a glass substrate or film for the fixation of an optical transducer on the irregular surface falls within the technical scope of the present invention.

An example of the optomagnetic recording medium according to the invention is now described.

Figure 24:
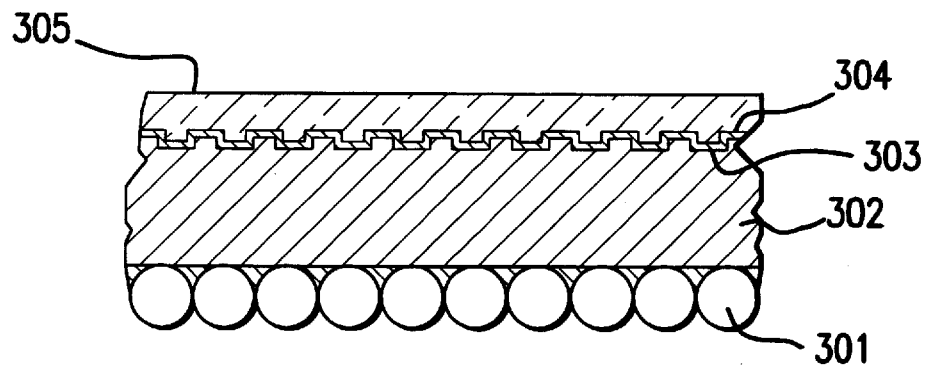
FIG. 24 is a schematic sectional elevation view of an optical recording medium comprising an acrylic resin substrate provided with an $SiO_2$ microgranular layer.

The upper surface of a compact disk fabricated using an acrylic resin as the substrate is rinsed with pure water and dried. This compact disk is dipped in a bath composed of a solution prepared by mixing ethyl silicate, ethanol, IPA, MEK, etc. with water and nitric acid for hydrolysis of ethyl silicate (S408, Asahi Glass) and a 20 wt. % dispersion of $SiO_2$ with a particle diameter of 80 nm in ethanol and raised in a perpendicular direction at a rate of 0.98 mm/second. After the volatile matter has been evaporated off, the disk is dried by heating at 60° C. for 30 minutes. The surface of the disk has a purple color. The disk in this condition is schematically illustrated in FIG. 24. The reference numeral 301 represents an SiO$_2$ powder, 302 an acrylic resin support, 303 a record surface, 304 an aluminum reflector film and 305 a protective coating.

The mechanism of continuous variation of the index of refraction for reducing the quantity of reflected light on the surface of the transparent member is explained with reference to FIG. 25. The index of refraction for the small depth dx in an arbitrary position from the air side toward the substrate can be found as follows. Thus, writing the refractive index of air as No, the refractive index of particles as Ng, and the volume of particles as Vdx, the mean refractive index for the small depth Ndx is expressed by the following equation.

$$Ndx = Nz \cdot Vdx + No(1-Vdx)$$

Therefore, the refractive index of the binder 306 for immobilization of SiO$_2$ powder 301 is preferably equal or close to the refractive index of substrate 302. In this manner, the index of refraction can be varied progressively from the refractive index of air, which is 1, to the refractive index of the substrate.

Figure 25:
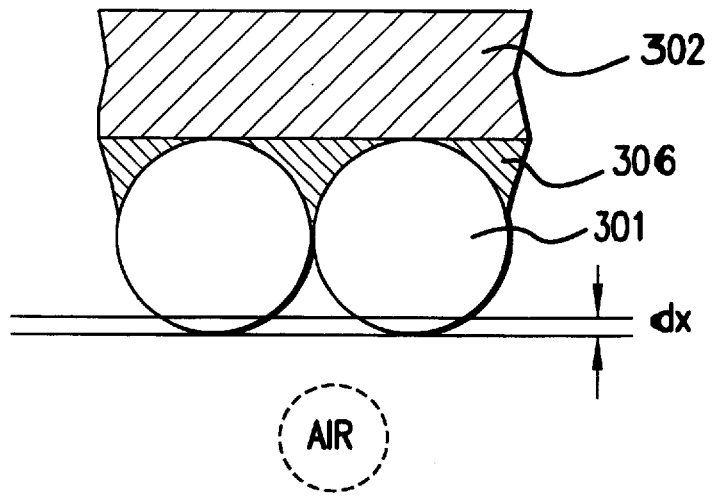
FIG. 25 is a schematic cross-section view showing the microgranular layer of FIG. 24 on exaggerated scale.
Figure 26:
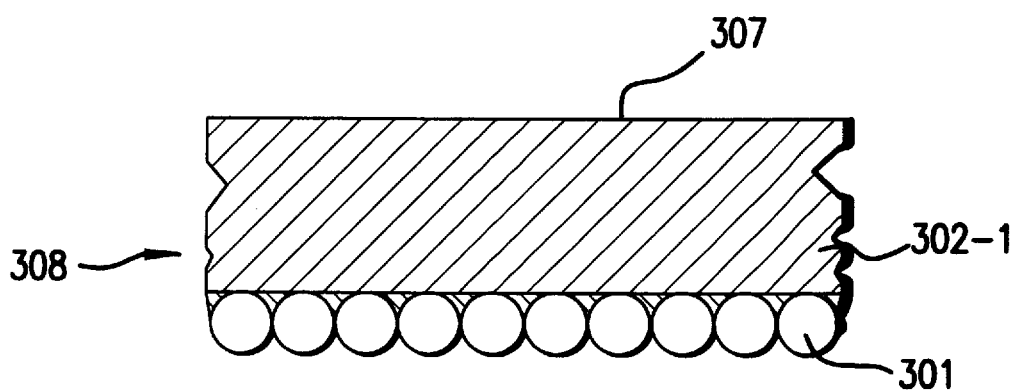
FIG. 26 is a schematic cross-section view of a testpiece used in the light transmission test with the microgranular layer.
Figure 27:
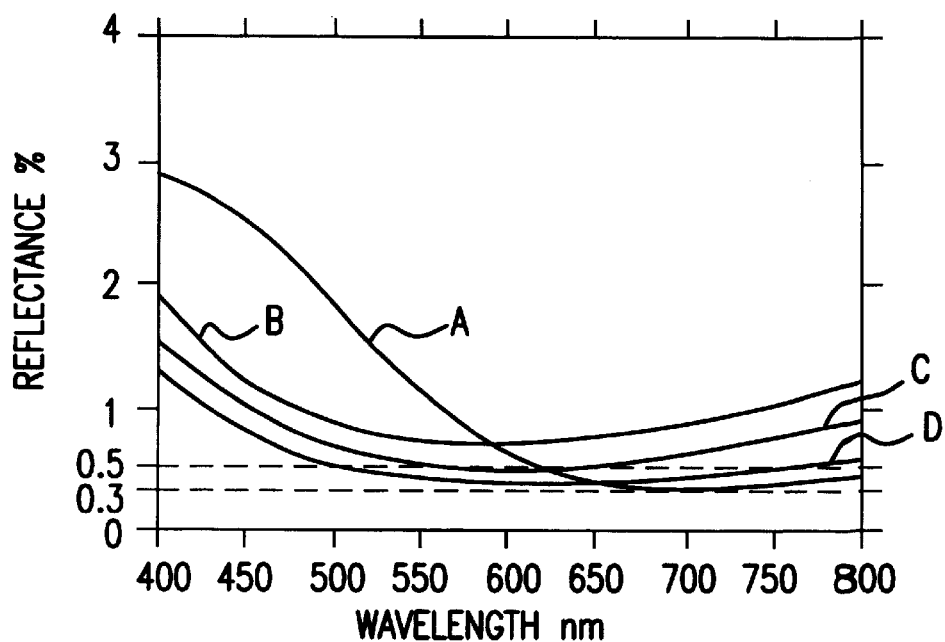
FIG. 27 shows curves representing the relation between wavelength and transmissivity for testpieces (A, B, C, and D).

Referring to FIG. 25, theoretically the diameter of particles may be large but as demonstrated experimentally, irregular reflection is prominent when the particle diameter exceeds about 600 nm, while the surface becomes flat to increase the amount of reflected light when the particle diameter is not larger than 10 nm. The experiment performed using microfine particles having different diameters at intervals of 50 nm within the range of 10 nm to 600 nm revealed that particle diameters within the range of 50 nm to 200 nm are suitable. Particularly as far as this invention is concerned, because the wavelength of the laser light for optical disks is in the range of 600 nm to 800 nm, the level of reflected light is preferably low in this wavelength band. The measurement of reflectance cannot be made in the condition of FIG. 24. Therefore, as shown in FIG. 26, a testpiece 308 is prepared from the same materials by adopting a planar surface on the opposite side with respect to the powder-immobilized side and dyeing it black to prepare a light-absorbing surface 307. The reference numeral 302-1 represents an acrylic resin board. The reflectance characteristic of the testpiece prepared by using a powder with a particle diameter of 80 nm is represented by Curve A in FIG. 27. Within the range of 600 nm to 800 nm, the reflectance is smaller than 0.5%.

Figure 28:
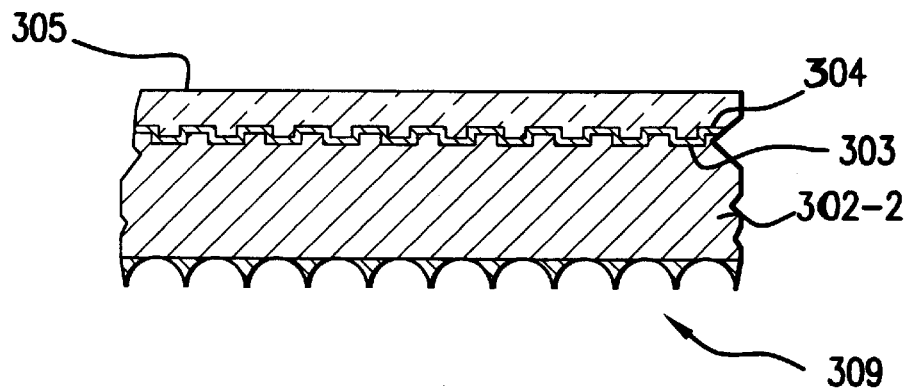
FIG. 28 is a schematic cross-section view of an optical recording medium provided with a microgranular layer by the transfer technique.

A second example of optomagnetic recording medium provided with an antireflective layer by the transfer technique is now described. An optical glass disk with a diameter of 12 cm and a thickness of 5 mm is rinsed with pure water and dried. Using a 20 wt. % dispersion of SiO$_2$ particles with a diameter of 100 mm in lieu of the dispersion of particles with a diameter of 80 mm as used in the first example, a dipping bath is prepared. The above glass disk is dipped in this bath and raised in a perpendicular position at a rate of 0.7 mm/second. After the volatile matter has been evaporated off, the disk is heated at 300° C. for one hour. After cooling to room temperature, the glass disk is taken out from the furnace and cleaned sonically to provide a matrix. For transfer to the recording surface of a VD or CD, the above matrix is used as one of injection molding matrices. A schematic cross-section viwes of the molding surface is presented in FIG. 28. This molding surface 309 represents substantial halves of SiO$_2$ microspheres. The reference numeral 302-2 represents an acrylic resin board. Since the reflectance of the above surface cannot be measured in the condition shown in FIG. 28, a testpiece 310 is prepared by forming a microgranular surface 309 on one side of acrylic resin board 302-2 and adopting a planar surface on the other side and dyeing the latter surface black to present a light-absorbing plane 307 and the reflectance of the molding surface 309 is measured. The reflection characteristic is represented by Curve B in FIG. 27. Here, the lowest reflectance value is obtained in the neighborhood of 550 nm. Since this example merely utilizes the transfer of the shape of particles, not only SiO$_2$ powders but also ZrO$_2$, TiO$_2$, and other powders can be employed. The shape of particles is preferably spherical.

A third example of the optomagnetic recording medium according to the invention is now described.

Figure 29:
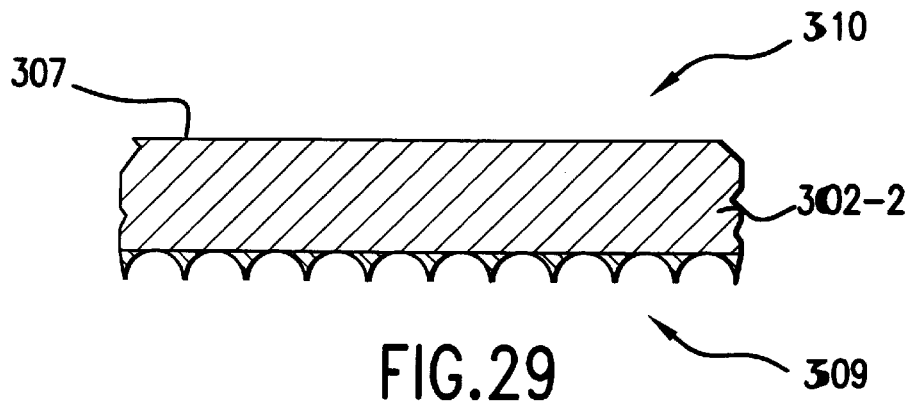
FIG. 29 is a schematic cross-section view of a testpiece for use in the transmission test with the recording medium obtained by the transfer technique.
Figure 30:
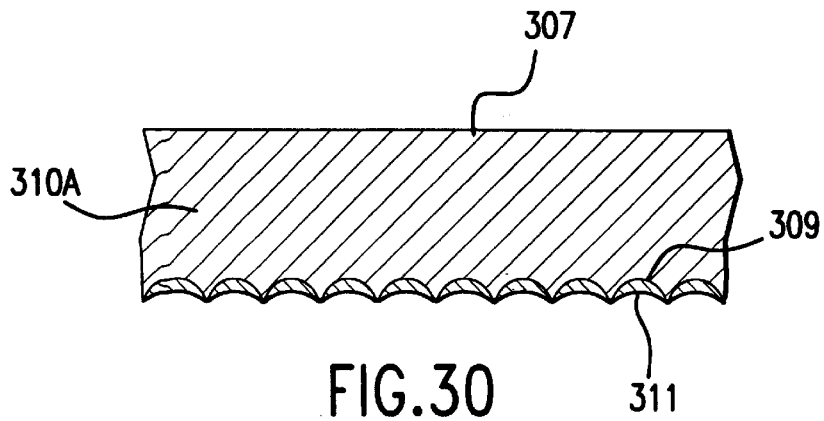
FIG. 30 is a schematic cross-section view of the testpiece in which the microfine recesses copied by the transfer technique have been filled with a substance having a different index of refraction.

Using the acrylic resin board 302-2 formed with a microgranular molding surface 309 on one side as described in the second example and depicted in FIG. 29, the recesses of its molding surface 309 are filled with a resin having a refractive index smaller than that of the acrylic resin. Secondary adhesion to acrylic resin can hardly be firm enough but the micro-granular surface made up of 100 nm particles can be expected to have an anchoring effect. In addition, a surface modification by UV irradiation is performed. As the coating, a fluorine series coating agent (Fluorad FC-722, Sumitomo-3M) with a refractive index of 1.36 is used. To control the film thickness and assist in the influx into the recesses, the coating agent is diluted to 30% with the solvent Fluorinert (ditto) and the coating is applied by the dipping method. FIG. 30 is a schematic cross-section view of the testpiece. The reference numeral 311 represents the fluorine series coating film. The surface reflectance of this testpiece 10$a$ is represented by Curve C in FIG. 27. As a trend, the reflectance characteristic is similar to that obtained in the second example but partly because of the continuous change in refractive index due to the surface configuration and partly because of the presence of a substance with a low refractive index of 1.36 at the interface with the air, the reflectance of the testpiece 10$a$ has been improved by about 0.1% in the neighborhood of 600 nm. This recording medium is not so receptive to soiling matter such as fingerprints and, therefore, has an additional advantage of practical importance.

A fourth example of the optomagnetic recording medium according to the present invention is now described.

Figure 31:
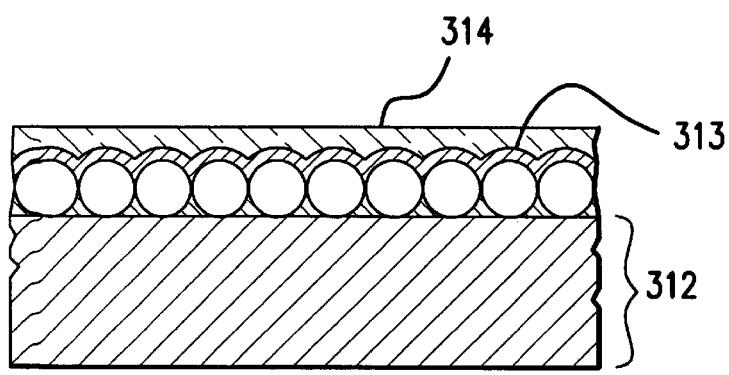
FIG. 31 is a schematic cross-section view of a matrix similar to that shown in FIG. 26 as provided with a VVD layer and an overlying plating layer.
Figure 32:
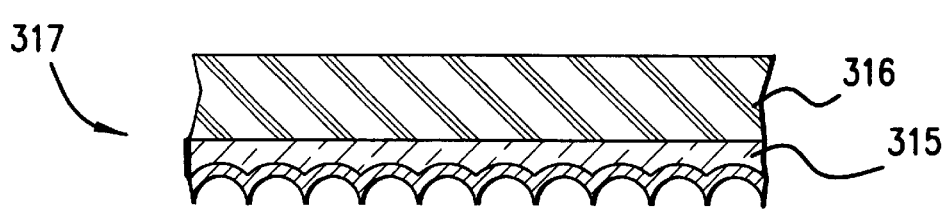
FIG. 32 is a schematic cross-section view showing a matrix fabricated by bonding a stamper stripped of the plating layer from the matrix of FIG. 31 to a nickel alloy sheet.
Figure 33:
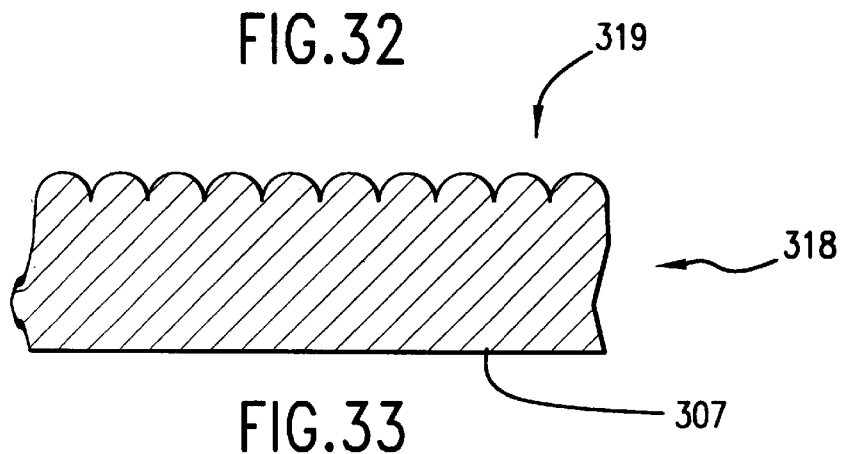
FIG. 33 is a schematic cross-section view showing an acrylic resin testpiece as injection-molded using the matrix shown in FIG. 32.

This example pertains to the transfer technique employing a stamper prepared using a matrix fabricated by immobilizing SiO$_2$ particles with a diameter of 100 nm on a glass substrate. As shown in FIG. 31, the same matrix 312 as used in the second example is sonically cleaned and a nickel VVD layer 313 is formed. Using this VVD layer as an electrode, nickel plating is carried out to form a nickel plating layer 314. This procedure is identical to the procedure for the preparation of an optical disk matrix. The plating layer 314 is then released to provide a stamper 315. To a nickel alloy plate 316 polished mirror-smooth for approximation of linear expansion coefficient is bonded the above stamper 315 with a heat-resistant adhesive to provide a matrix 317 (FIG. 32). Using this matrix 317, an acrylic resin is injection-molded to give a testpiece 318 (FIG. 33). A black-dyed light-absorbing layer 307 is formed on this testpiece 318 and the reflectance of the molding surface 319 is measured. The reflectance of this testpiece is represented by Curve D in FIG. 27. The trend of this curve approximates the trend observed when a SiO$_2$ powder with a diameter of 120 nm is arranged in a single layer on a glass substrate. This is probably due, at least in part, to the fact that the material forming microfine projections is not SiO$_2$ but acrylic resin.

Since the stamper can be used as fixed to a flat substrate as mentioned above or a roll, a microgranular surface can be formed not only on an optomagnetic recording medium but also on the surface of a transparent film or board. Thus, it can be applied to the digital display panels of showcases and electronic devices, among other uses. Therefore, the technology finds application in a broader field.

The photosensitive material embodying the principle of the present invention is now described.

Figure 34:
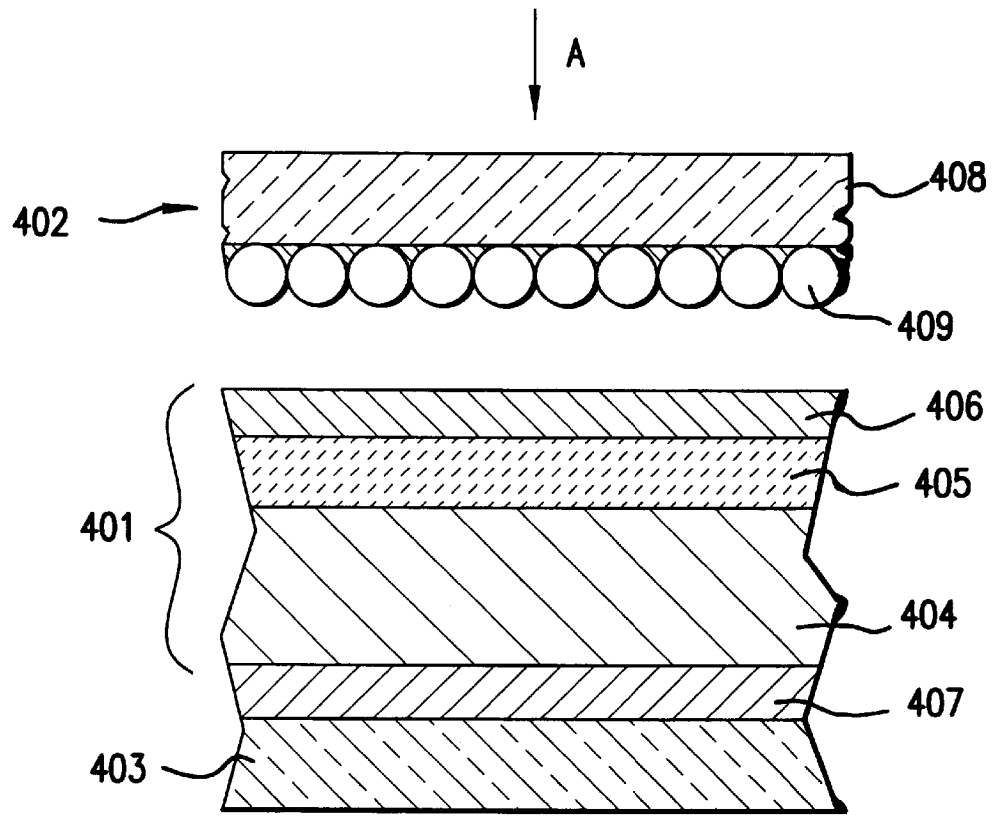
FIG. 34 is a schematic cross-section view showing a process for the fabrication of a photosensitive material in accordance with the invention.

FIG. 34 is a schematic cross-section view showing a typical procedure for fabricating a photosensitive material of the present invention. The reference numeral 401 represents a photosensitive material, 402 a matrix, and 403 a glass plate as a backing plate. The photosensitive material 401 consists of a film 404, a photographic emulsion layer 405, a protective layer 406, and a back-coating layer 407.

The procedure of preparing a matrix 402 is first described. An optical glass plate 408 with a thickness of 5 mm is provided, rinsed with pure water, and dried. For use as a dipping bath, a solution comprising ethyl silicate, ethanol, IPA, MEK, etc. together with water and nitric acid for hydrolysis of ethyl silicate (S408, Asahi Glass) is mixed with a 20 wt. % dispersion of a microfine powder of $SiO_2$ in ethanol. The glass plate 408 is dipped in this bath and raised in a vertical position at a rate of 0.98 mm/second. After evaporation of the volatile fraction, the glass plate is heated in a furnance at 300° C. for one hour. After cooling to room temperature, the glass plate is taken out from the furnance and subjected to ultrasonic rinsing to provide a first matrix 402. The reference numeral 409 represents a microfine powder of $SiO_2$.

A cellulose triacetate film 404 is coated with the photographic emulsion 405 and back coating (hard gelatin) 407, dried, and set in position on the backing plate 403 with a cellophane tape. Then, using a roll coater, an aqueous solution of gelatin is applied to the top surface of the photographic emulsion layer 405 and dried. In the semi-dried state, the matrix 402 is pressed against it in the direction of arrowmark A in FIG. 34. A clip is applied to the backing plate 403 and glass plate 408 for clamping and the clamped assembly is set in a vacuum heating laminator, in which it is dried at 30° C. for 5 minutes. The semi-dry gelatin in the protective layer 406 is in swollen condition and when it is pressed against a flat plate, air is entrapped and, moreover, it takes time to drain off the water. The use of a roll-shaped matrix contributes to a higher efficiency. A schematic cross-section view of the photosensitive material withdrawn from the laminator is presented in FIG. 35. The protective layer 406-1 forms a transfer molding surface 410 reflecting the pattern of ultrafine particles 409.

Figure 35:
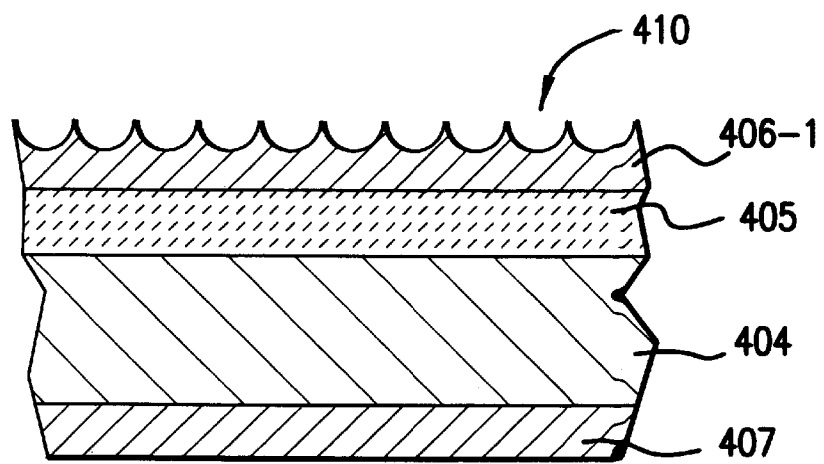
FIG. 35 is a schematic cross-section view showing a typical photosensitive material of the invention.
Figure 36:
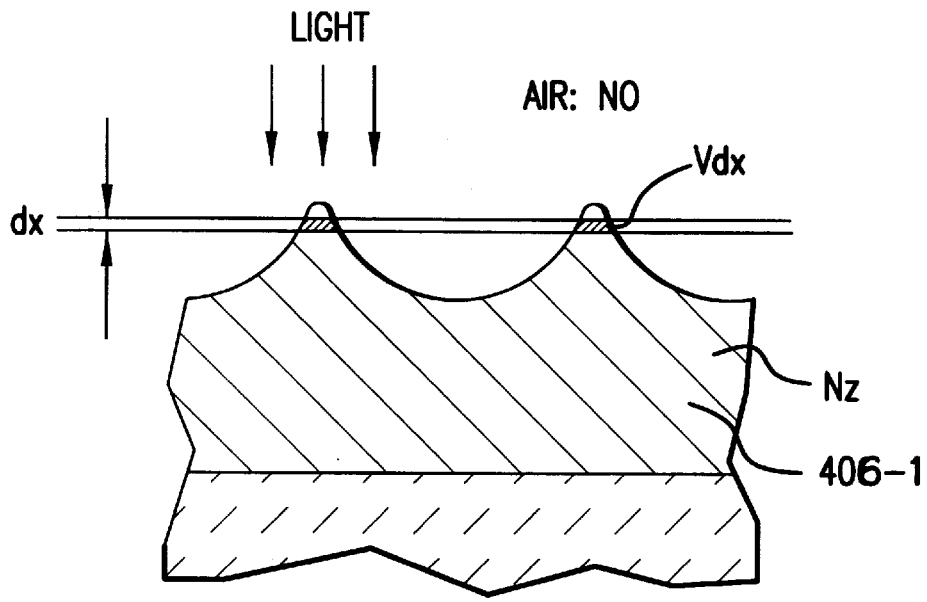
FIG. 36 is a partial cross-section view, on exaggerated scale, of the transfer surface for assisting in the understanding of antireflective function.

FIG. 36 is a view showing a part of the transfer surface 410 of FIG. 35 on exaggerated scale. Writing the refractive index of gelatin constituting the protective layer 406-1 as Nz and the refractive index of air as No, the mean index of refraction relevant to the small dimension dx in the direction of advance of light can be expressed by the following equation.

$$Ndx=Ng \cdot Vdx+No(1-Vdx)$$

Therefore, the refractive index of transmitted light undergoes a progressive transition from the refractive index of air to the refractive index of gelatin and this gradual change in the index of refraction not only inhibits reflection of light but also improves the transmission of light. However, when the particle diameter of the $SiO_2$ powder is not larger than 30 nm, the transfer mold surface is too flattened to provide a useful antireflective effect. On the other hand, when the particle diameter exceeds 600 nm, the transfer surface is matted to reduce the transmission of light in a serious degree. The proper range of particle diameter is 50 nm–200 nm.

Figure 37:
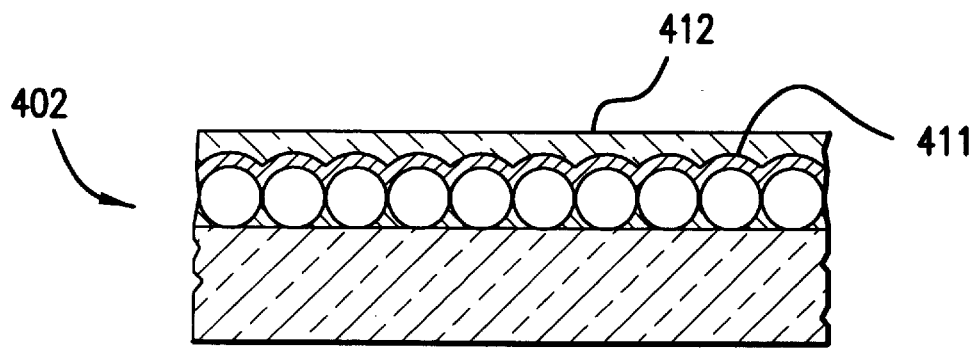
FIG. 37 is a schematic cross-section view showing another example of the process for fabrication of a matrix.
Figure 38:
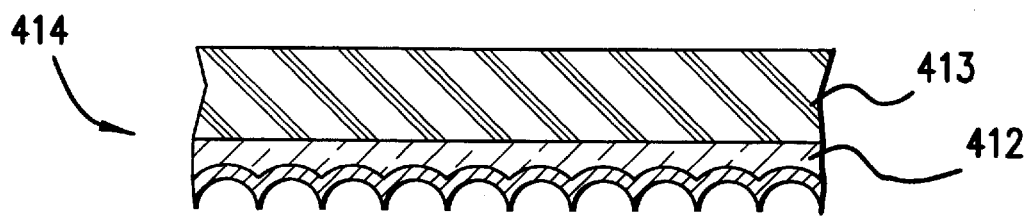
FIG. 38 is a schematic cross-section view of a second matrix.

As a second example, the procedure of preparing a second matrix is now described. Using the matrix 402 illustrated in FIG. 34, a nickel VVD layer 411 is formed on its microgranular surface and using this nickel VVD layer 411 as an electrode, nickel plating is performed to form a nickel plating layer 412 as shown in FIG. 37. This process is similar to the process for manufacture of an optical disk matrix. The nickel plating layer 411 is then removed and the matrix is attached to the mirror-polished surface of a nickel alloy plate 413 to provide a second matrix 414 (FIG. 38).

Figure 39:
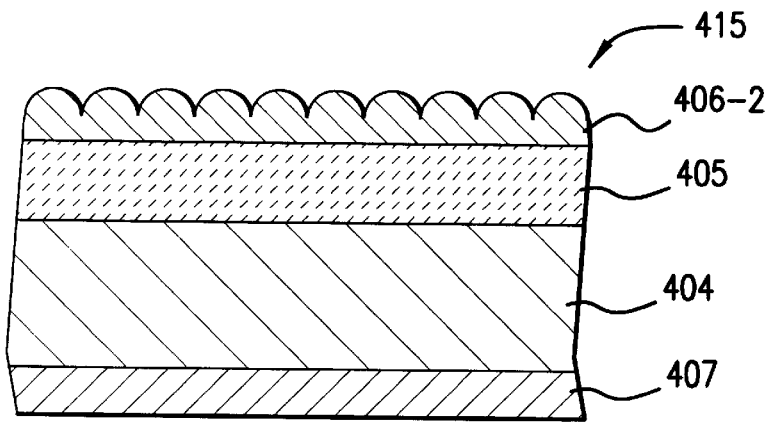
FIG. 39 is a schematic cross-section view showing another typical photosensitive material of the invention.
Figure 40:
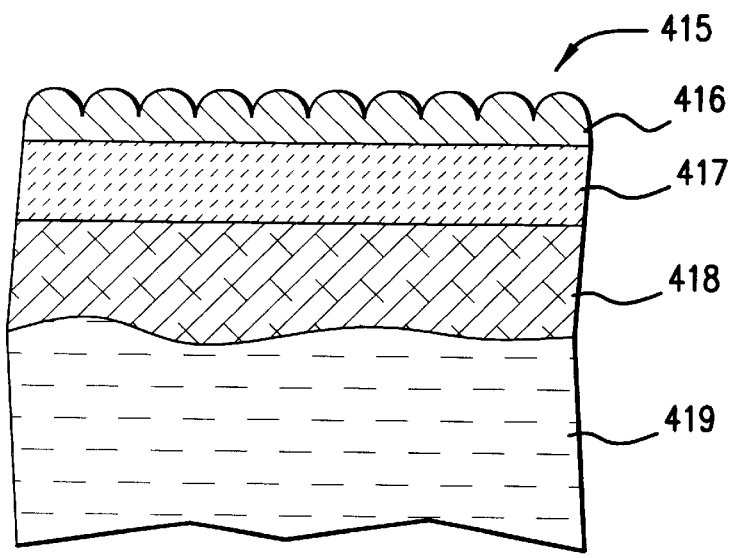
FIG. 40 is a schematic cross-section view showing still another typical photosensitive material of the invention.

FIG. 39 is a schematic cross-section view of the photographic material obtained by using the second matrix in the same manner as in the first example. The transfer surface 415 has convex areas in contrast to the concave areas in the first example and has an antireflective function. The above technique can be applied to a photographic printing paper as well. FIG. 40 is a schematic cross-section view of the photo-graphic printing paper. The reference numeral 416 represents a protective gelatin layer and the reference numeral 415 represents a transfer surface which forms an interface with air. The reference numeral 417 represents a photographic emulsion layer, 418 a baryta layer, and 419 a paper stock. Since the photographic paper is a means by which a recorded image is viewed in hand-held position, visual inspection is facilitated when there is no surface reflection. With the photo-graphic paper of this example, a bright picture image different from a matted image can be seen.

Since any matrix is intended for repeated use, the first matrix shown in FIG. 34 has a risk for dislodgement of ultrafine particles 409. Therefore, a third matrix identical to the first matrix can be fabricated by utilizing the second matrix 414 of FIG. 38. Since this third matrix is integrated with a nickel metal, a longer matrix life can be insured.

A third example of the photosensitive material according to the present invention is now described.

Figure 41:
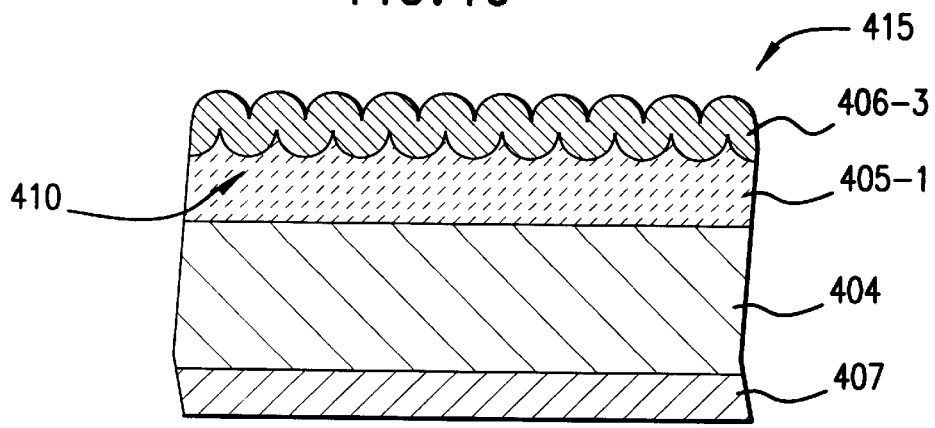
FIG. 41 is a schematic cross-section view showing another yet typical photosensitive material of the invention.

FIG. 41 shows a photosensitive material provided with an antireflective function at an additional interface, that is to say the interface between a photographic emulsion layer 405-1 and a protective layer 406-3. In the semi-dry state of the photographic emulsion 405-1, a transfer surface 410 comprising a concave-microgranular surface is formed on the emulsion side by using said first matrix and, then, a protective layer composed predominantly of gelatin is formed in superimposition. Then, using the second matrix, a transferred surface 415 is formed at the interface between the protective layer 406-3 and the air. Since a reflected light is unavoidably formed in a proportion of about 4% at the interface between two different light-transmitting substances, it is desirable to impart an antireflective function to the interface as far as feasible.

A fourth example of the photosensitive material is now described.

Figure 42:
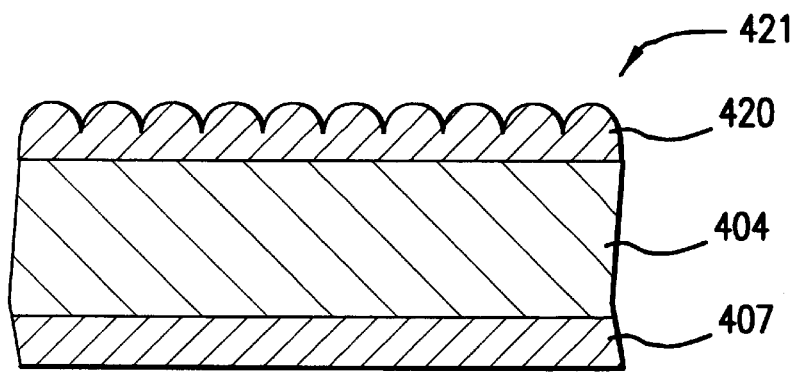
FIG. 42 is a schematic cross-section view showing a photosensitive material comprising a film and an antireflective layer disposed thereon.

As illustrated in FIG. 42, a antireflective layer 420 is formed on one side of a support film 404. Since the photographic emulsion is poorly adherent to a film, a subbing layer is formed with a coating solution composed of gelatin, a solvent for the film material, a surface tension depressant, etc. and a transferred surface 421 is then formed using the first or subsequent matrix to build in an antireflective layer 420. This antireflective layer 420 is effective in preventing halation and irradiation owing to the reflection of light on the film surface. Such an antireflective layer 420 may be formed at the interface between the film 404 and a back coating layer 407.

Figure 43:
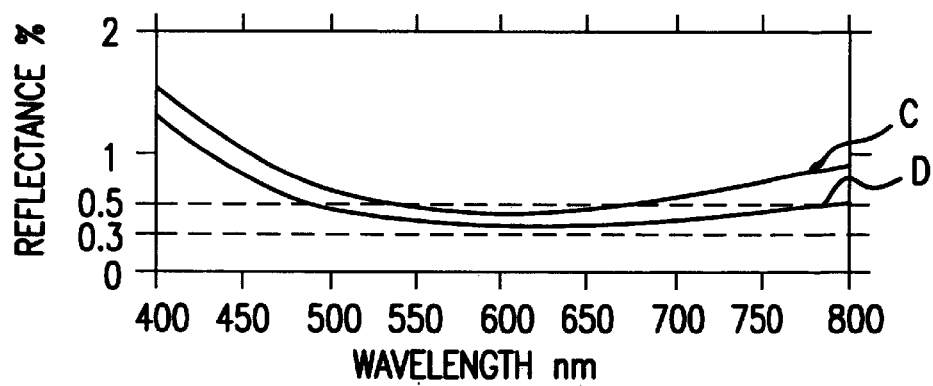
FIG. 43 shows reflectance characteristic curves of transfer surfaces.
Figure 44:
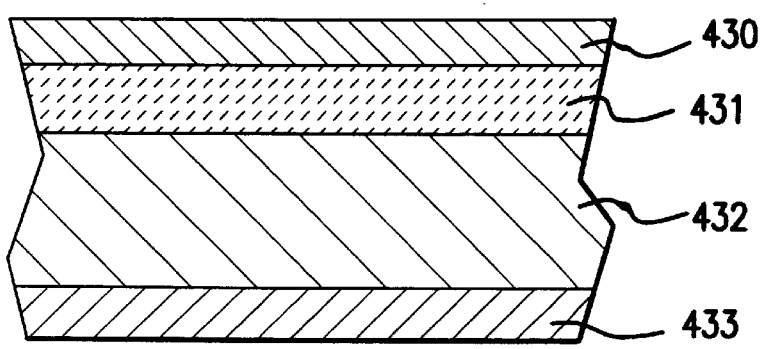
FIG. 44 is a schematic cross-section view of the conventional negative film.
Figure 45:
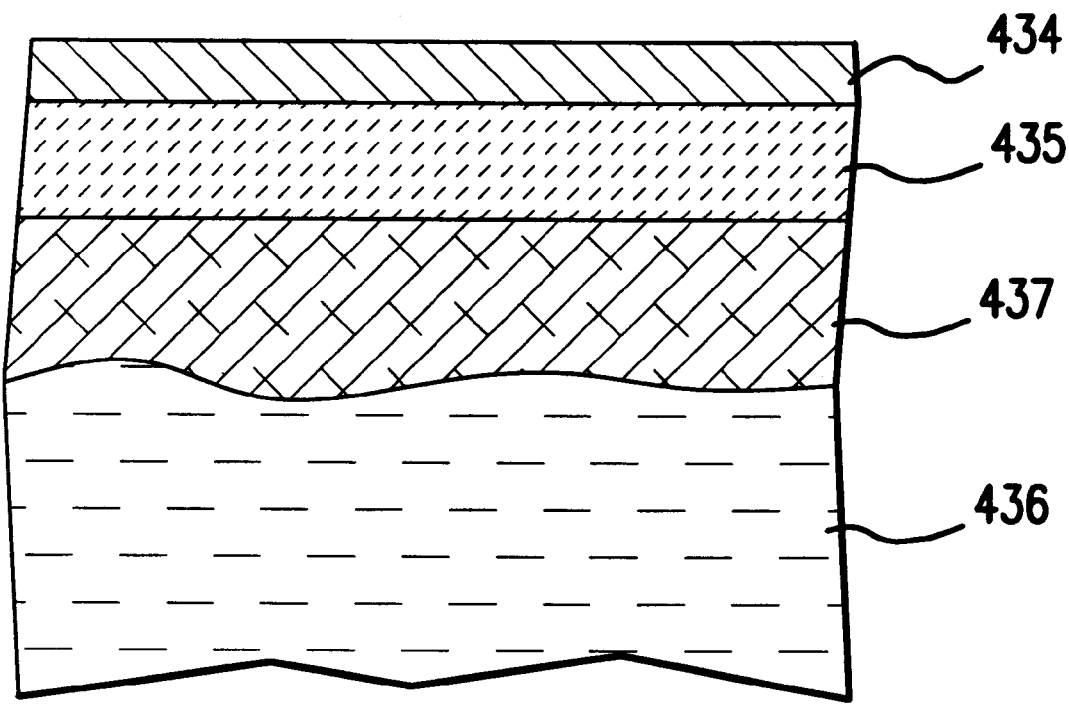
FIG. 45 is a schematic cross-section view of the conventional photographic printing paper.

The reflectance on the above-described transferred surface has a characteristic shown in FIG. 43. Thus, the reflectance is less than 1% for the most part in the visible region of the spectrum and can be held as low as about 0.5% in the wavelength band around 550 nm where the human eye perceives light with the greatest intensity. In FIG. 43, Curve C represents the reflectance of the transferred surface obtained by using a first matrix and Curve D represents the reflectance of the transferred surface obtained by using a second matrix.

An example of the fabrication of an electronic circuit is now described.

Figure 46:
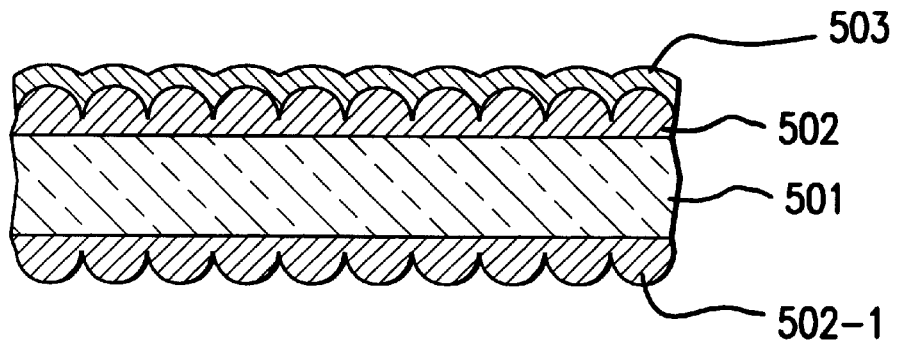
FIG. 46 is a schematic cross-section view of the photomask blank for use in the exposure system of the invention.

FIG. 46 is a schematic cross-section view of a mask blank for a light-transmitting member as provided by application of the production technology of the present invention. The reference numeral 501 represents a glass substrate board, 502 and 502-1 each represents an antireflective layer having a surface presenting microgranular irregularities, and 503 represents a light-shielding layer. The surface presenting microgranular irregularities constitutes a heterogeneous layer showing a continuous change in the index of reflection and though the geometry of irregularities is self-limited in depth, the depth is preferably in the range of 15–150 nm. If feasible, the irregularities are preferably acicular (needle-like). As a means for meeting the above requirement, microfine $SiO_2$ particles are immobilized in a compact single layer on a substrate and the surface shape of this layer is transferred to obtain a convex-concave micro-granular surface in this example.

Figure 47:
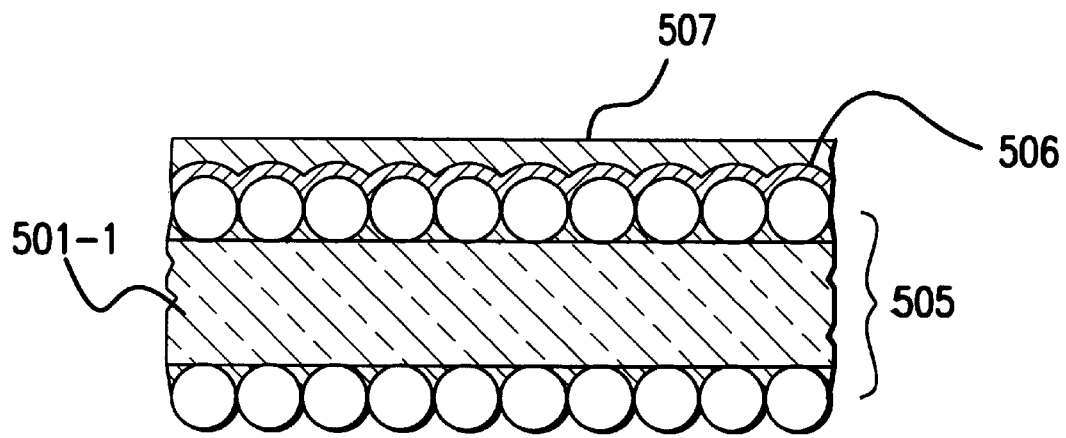
FIG. 47 is a schematic sectional view showing a process for fabrication of a stamper.

Referring to FIG. 47, a dipping bath is prepared for immobilizing $SiO_2$ particles in a single layer on a polished surface of a flat glass substrate 501-1. The bath is prepared by dissolving ethyl silicate in ethanol, adding $H_2O$ and, as catalyst, $HNO_3$ for hydrolysis to the solution, adding 10 weight % of a microfine $SiO_2$ powder with a particle diameter of 80 nm, and adjusting the pH of the mixture to provide a dispersion. The above glass plate is dipped in the bath and raised in a perpendicular direction at a rate of 1 mm/second. After evaporation of the volatile matter, the treated glass plate is incubated at 200° C. for 30 minutes and, then, dried to provide a matrix 505. The $SiO_2$ monolayer surface thus obtained shows a reflectance of 0.8% at the incident light wavelength of 400 nm and 0.3% at 550 nm (one side). The glass alone shows a reflectance of 4–5% (one side). Though this can be used as the substrate for masking purposes, there is the disadvantage that it is time-consuming to provide a large quantity of glass.

Figure 48:
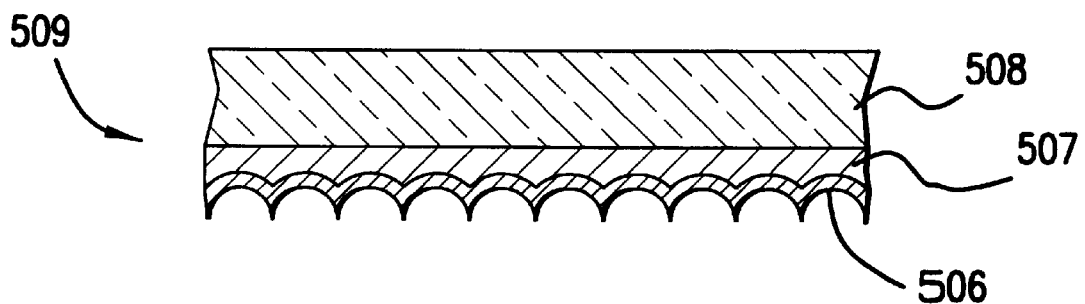
FIG. 48 is a schematic cross-section view of the stamper.

The technique for transferring a microgranular surface comprising $SiO_2$ particles immobilized on a glass substrate is now described. Referring to FIG. 48, the above matrix 505 prepared by immobilizing microfine $SiO_2$ particles on a glass substrate is rinsed with pure water and dried, and using a vacuum vapor deposition machine, a nickel VVD layer is formed. Then, using the VVD layer 506 as an electrode, a nickel substrate 507 is fabricated by electrocasting. This nickel substrate 507 is released and bonded to another glass plate 508 to provide a stamper 509. Using this stamper as a second matrix, a third matrix can be fabricated.

Figure 49:
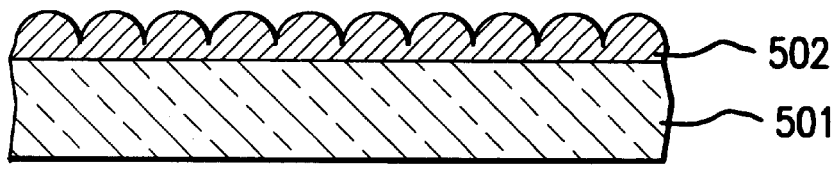
FIG. 49 is a schematic cross-section view showing an antireflective layer as formed on a glass substrate.

In transfer molding, a glass substrate 501 rinsed with pure water is provided. The irregular surface of the stamper 509 is thinly coated with a silane coupling agent (KBM403, Shin-Etsu Chemical) and, after degassing, bonded to the glass plate 501. The whole surface is pressed strongly to force out the excess silane coupling agent. Care is exercised not to entrap air, for example by using a negative-pressure laminator. When the nickel surface of the stamper is inactivated beforehand, the separation of the stamper from the silane coupling agent is facilitated and the silane coupling agent adhering firmly to the glass surface forms a concave-convex microgranular surface to act as an antireflective layer 502 (FIG. 49). The surface reflectance of the glass substrate thus obtained is as low as 1.2–1.5% at the incident light wavelength of 400 nm.

Figure 50:
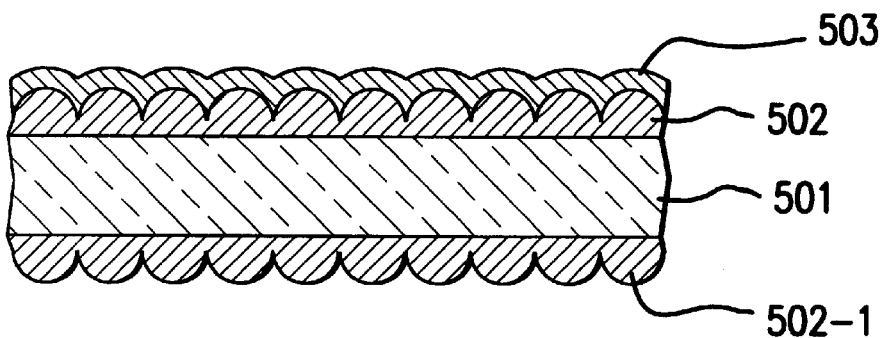
FIG. 50 is a schematic cross-section view showing the paper of FIG. 45 as further provided with a light-shielding layer by the VVD technique.

On top of this antireflective layer 502, Cr is deposited in a thickness of 50–100 nm to form a light-shielding layer 503 by the vacuum vapor deposition technique as illustrated in FIG. 50. Since the interface between the light-shielding layer and the antireflective layer 502, both having concave-convex microgranular surfaces, are heterogenous layers, the amount of reflected light at the interface is remarkably decreased and a reflectance value of not greater than 2% is obtained. In this example, an antireflective layer 502-1 is formed on the incident side of the glass substrate, too, by the same technique.

A second example of the fabrication of an electronic circuit is now described.

Figure 51:
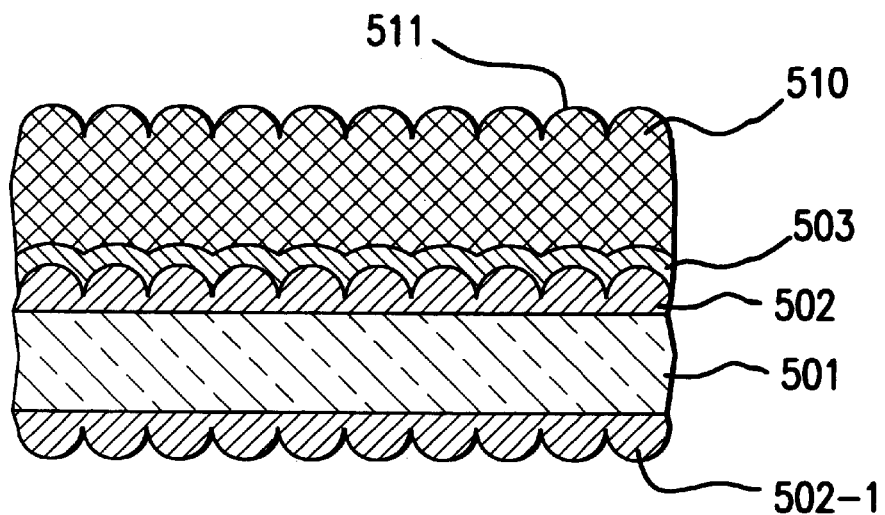
FIG. 51 is a schematic cross-section view of the member of FIG. 50 as further provided with a resist layer.
Figure 52:
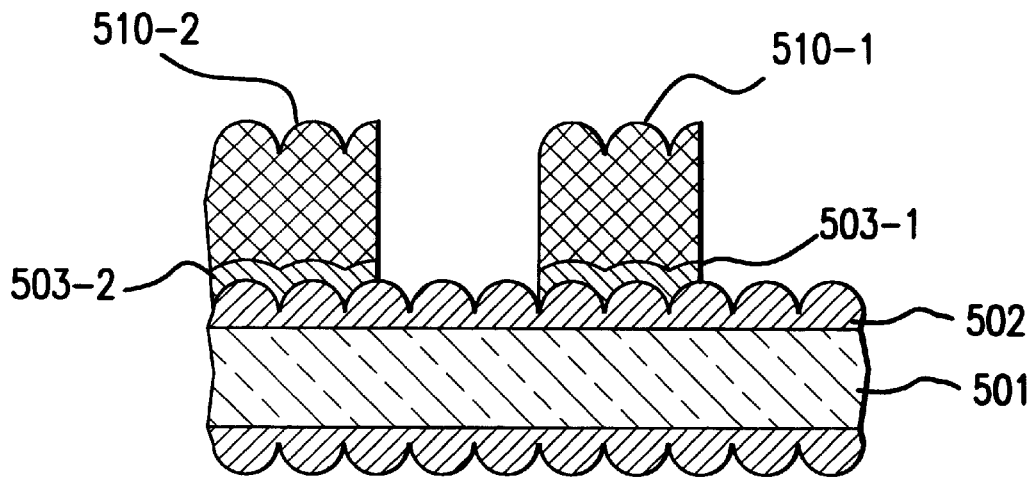
FIG. 52 is a schematic cross-section view showing the product of FIG. 51 as etched to partially expose the antireflective layer.

A resist layer 510 is formed on the photomask blank obtained in the first example and the stamper 509 is pressed against the resist layer under reduced pressure to create an irregular surface 511 comprising hemispheres each having a radius of curvature of 40 nm (FIG. 51). This irregular surface reduces the quantity of reflected light and improves the absorbance. For the fabrication of a photomask, a hard mask is placed intimately on the above resist layer and a monochromatic light with a wavelength of 400–450 nm is projected. After irradiation, the latent image is developed with a developer to remove the resist in the irradiated areas to partially expose the light-shielding layer 503. Then, etching of Cr is carried out with hydrochloric acid to partially expose the antireflective layer 503. A schematic cross-section view of this condition is presented in FIG. 52. The residual resist is then dissolved out with acetone and thorough rinse is carried out to complete a Cr micropattern.

The line breadth of the photomask thus-obtained features a high degree of precision because of reduced reflected light and interference light but since the pattern is printed with the hard mask in close contact, the line breadth is 5–10 $\mu$m. Therefore, in the current patterning practice requiring a line breadth of less than 1 $\mu$m, the use of a reduction projection exposure technique is recommended. In this sense, it is important to enhance the transmission of irradiating light and prevent unwanted light reflection and interference. Moreover, since the above concave-convex microgranular surface reduces the reflection of light on the resist surface, the technique can be applied to the surface of the resist layer on a wafer to give a pattern print with a minimum of coving and a precise reproduction of line breadth on the wafer.

A third example of the fabrication of an electronic circuit is now described.

Figure 53:
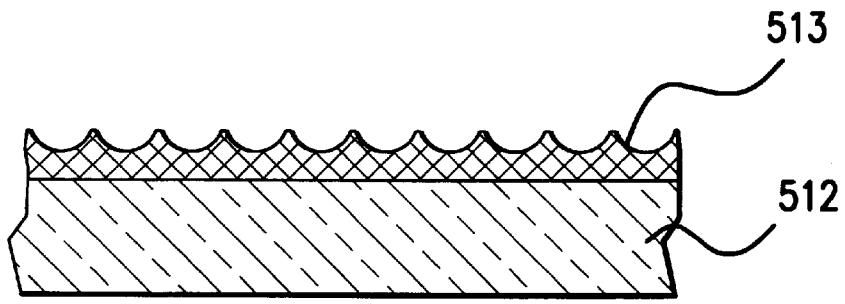
FIG. 53 is a schematic cross-section view showing another process for fabrication of a stamper.
Figure 54:
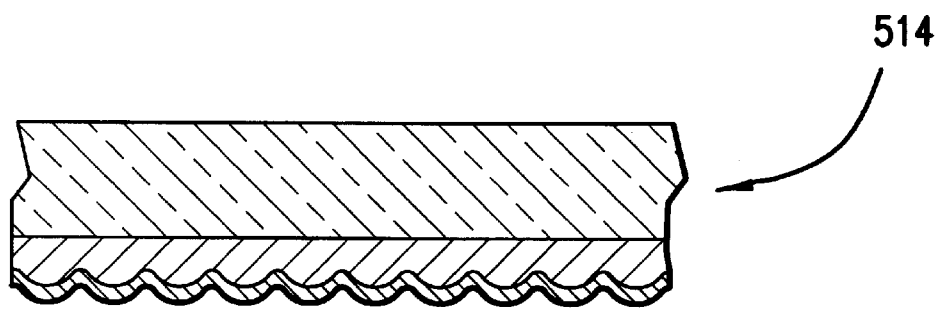
FIG. 54 is a schematic cross-section view of the stamper by said another process.

An alternative technique for fabricating said stamper 509 is first explained. A polished smooth glass substrate is coated with a photoresist material by the spin coating method in a maximum thickness of 0.5 $\mu$m and the coat is prebaked. Using a 1/10×projection exposing machine, the light through a photomask having a pattern of 1 $\mu$m squares with a line breadth of 1 $\mu$m is focused on the above photoresist. Since the use of a ultraviolet light source causes a coving of the image, there are formed intensely exposed areas, weakly exposed areas, and unexposed areas at 0.1 $\mu$m pitches in the photoresist. This photoresist is developed with a developer to remove the exposed areas. A schematic cross-section view of this condition is presented in FIG. 53. The reference numeral 512 represents a glass substrate and the reference numeral 513 represents a photoresist layer. Since the film thickness of the photoresist cannot be accurately controlled, it is set to about 0.3–0.5 $\mu$m and the depth of the areas removed by exposure is limited to a maximum of about 0.3 µm. After development, the plate is rinsed and postbaked at 90° C. for about 10 minutes to stabilize the surface in the removed areas and a stamper is fabricated by the technique described hereinbefore. While the stamper 514 thus obtained shows the cross section illustrated in FIG. 54, there is a microscopic variation in the dimensional difference of irregularities. This stamper approximates the surface transferred from a surface comprising a mono-layer of particles of $SiO_2$ with a diameter of 100 nm and forms a heterogeneous layer. Therefore, the stamper obtained in this example is not only suited for the purposes of the invention but can be used for the prevention of surface reflection of other transparent resin parts. By using an electron beam or the like in lieu of ultraviolet light for exposure, an irregular surface of greater definition can be obtained.

A fourth example of the fabrication of an electronic circuit is now described.

Figure 55:
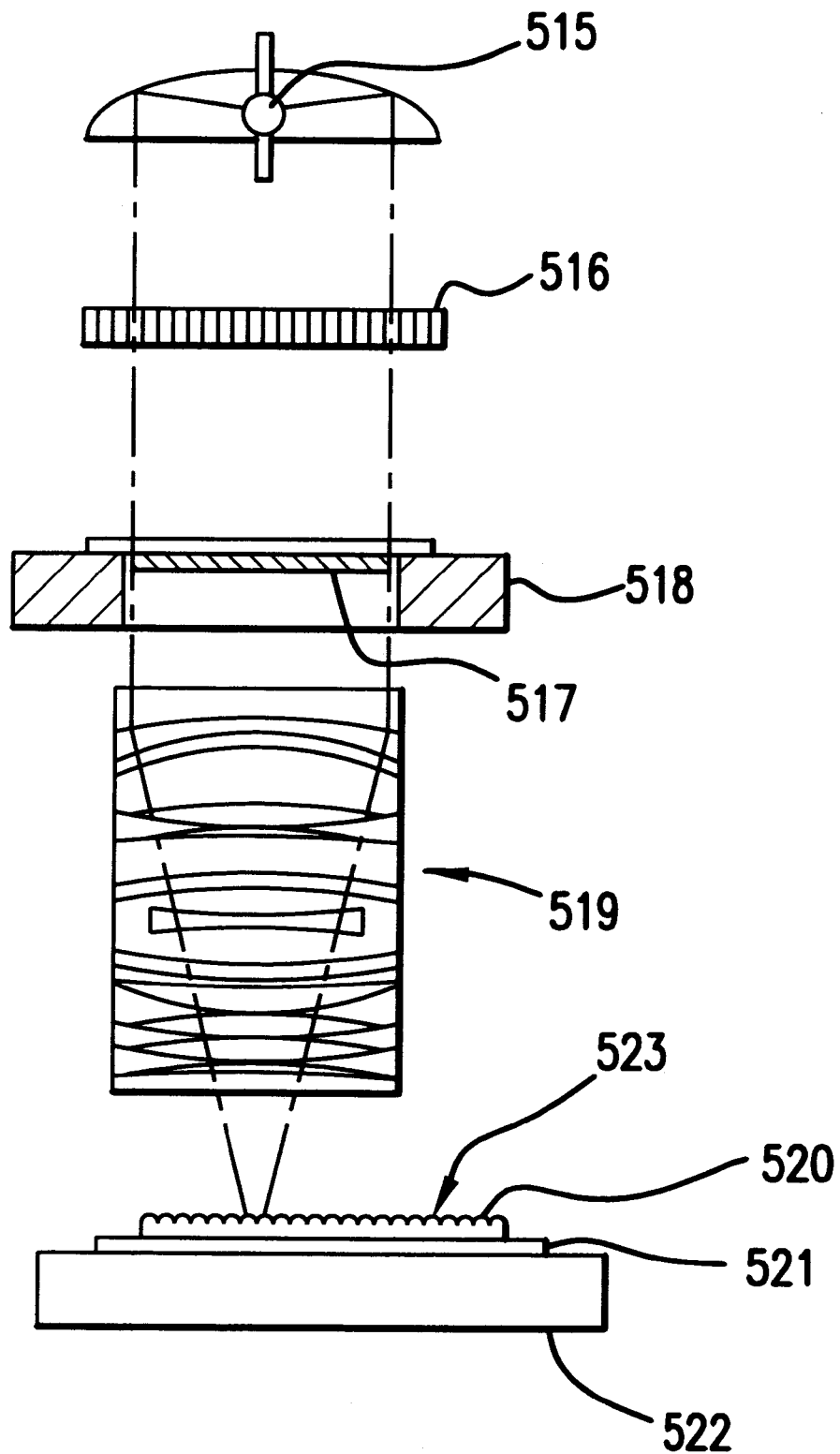
FIG. 55 is an elementary side-elevation view of a typical reduction-projection exposure apparatus.

FIG. 55 is a schematic view of a reduction projection exposure apparatus. The reference numeral 515 stands for a high-pressure mercury-vapor lamp as a light source, 516 a condenser, 517 a photomask, 518 a mask mount, 519 a reduction lens system, 520 a wafer, 521 a wafer chuck, 522 an X-Y stage for positioning, and 523 a photoresist layer. The side on which the photomask pattern is formed and the other side have convex- and concave- microgranular surfaces as mentioned above so that the reflection and interference of light are decreased to enhance the transmission of projected light. While the reduction lens system is generally a combination of about 8–11 lenses which is adapted to eliminate various aberrations, the reflected light and scattered light on the lens surface adversely affect the contrast of the pattern and reduces the quantity of transmitted light. The light from the mercury-vapor lamp used as a light source has a certain bandwidth within the range of 300–450 nm but is preferably of short wavelength. Therefore, as the performance of the lens, high contrast rather than high resolution is valued.

In this example, the lens is formed with a concave- and convex-microgranular surface to make a heterogeneous layer varying continuously in the index of reflection and thereby reduce the reflected light and give an image of good contrast. The concave- and convex-microgranular surface is obtained by transfer of a surface comprising a close monolayer of $SiO_2$ particles with a diameter of 80 nm. Therefore, the difference in height of the surface irregularities is less than 40 nm and the thickness of the heterogeneous layer is less than 40 nm. In transfer molding, the above particles are immobilized on the sur ace of a lens beforehand and this surface is copied in a metal mold to give a matrix. A thin resin layer is necessary for the formation of a transfer surface on the lens surface. Although a silane coupling agent was used, other resins such as a polyester resin, urethane resin, epoxy resin, or fluororesin can also be employed. In any event, the use of a resin resistant to the etching solution is preferred. When a UV light source is employed, there is the perennial problem of aging of the resin but since the irradiation time is only a few seconds per dose, practically no problem is encountered. Moreover, because of transfer molding, retouching is easy. Of course, the matrix prepared by immobilizing $SiO_2$ particles in a closely packed monolayer can be used as it is in the reduction lens system, but the particle diameter range of 40–50 nm should be adopted in such cases.

INDUSTRIAL APPLICABILITY

Since the microgranular surface for reducing reflected light according to the present invention can be formed in the molding of a lens, it is no longer necessary to provide the conventional multi-layer metal film so that the production process can be simplified and the production cost reduced. In addition, since this technique can be applied to an injection molding process, lenses having an antireflective function can be produced in a continuous line. As to staining by soiled hands and for improvement of water repellency, the fluorine series coating agent Fluorad (Sumitomo-3M) is effective, and since its refractive index of 1.36 is lower than that of $MgF_2$, it is contributory to reduction of the quantity of reflected light.

Furthermore, in accordance with the present invention, a solar cell having an antireflective function varying continuously in the index of refraction and tailored to the energy distribution of a light source can be provided, for the wavelength band of light whose reflection is to be prevented can be freely chosen by using particles of the proper diameter for the matrix. Moreover, since the light-receiving area can be increased by fixing an optical transducer on the microgranular surface, a solar cell with a greater current capacity per unit floor area can be fabricated.

Furthermore, the optomagnetic recording medium, e.g. optical disk, equipped with the antireflective layer according to the present invention reduces reflection of laser light on the disk surface and improves the efficiency of arrival of reflected light from the record surface so that the record can be read out with increased clarity. This is because of reduced light interference at the interface between air and the disk surface.

In the photosensitive material of the present invention, the reflection of light at the interface of substances present in the light path to the photographic emulsion is minimized to increase the quantity of transmitted light and, at the same time, attenuate halation and irradiation. In the photographic printing paper, surface glare is inhibited to present a clear picture.

The photomask blank according to this invention is subjected to resist coating, pattern printing, and etching for use as a photomask. Since the unwanted light reflection from the surface of the glass substrate and the surface of the light-shielding layer is reduced, the generation of interference light is minimized to insure a sharp pattern exposure.

What is claimed is:

1. A convex-microgranular surface structure of optical resin for varying continuously in an index of refraction for reduction of reflected light, the convex-microgranular surface structure being produced by the following steps:

providing a convex-microgranular surface formed of spherical particles adhered on a substrate;

forming a mold having a concave-microgranular transfer surface obtained by transfer formation from said convex-microgranular surface on said substrate; and molding said optical resin in said mold to form said convex-microgranular surface structure.

2. The convex-microgranular surface structure according to claim 1 wherein said optical resin is molded as a sheet member having a side with the convex-microgranular surface structure molded therein.

3. The convex-microgranular surface structure according to claim 1 wherein said spherical particles are $SiO_2$ particles.

4. The convex-microgranular surface structure according to claim 3 wherein said $SiO_2$ particles have a diameter in the range of 30 to 300 nm.

5. The convex-microgranular surface structure according to claim 4 wherein said substrate is glass.

6. The convex-microgranular surface structure according to claim 5 wherein the step forming said mold includes the steps of:

depositing a metallic film on said convex-microgranular surface formed of said spherical particles;

plating a metal layer onto said metallic film;

bonding a mold blank to said metal layer; and separating said metallic film, said metal layer and said mold blank bonded in unison from said convex-microgranular surface formed of said spherical particles to form said mold with the metallic film forming said concave-microgranular transfer surface.

7. The convex-microgranular surface structure according to claim 6 wherein said metallic film and said metal layer are nickel and said metallic film is deposited by vacuum vapor deposition.

8. The convex-microgranular surface structure according to claim 1 wherein the step forming said mold includes the steps of:

depositing a metallic film on said convex-microgranular surface formed of said spherical particles;

plating a metal layer onto said metallic film;

bonding a mold blank to said metal layer; and separating said metallic film, said metal layer and said mold blank bonded in unison from said convex-microgranular surface formed of said spherical particles to form said mold with the metallic film forming said concave-microgranular transfer surface.

9. The convex-microgranular surface structure according to claim 8 wherein said metallic film and said metal layer are nickel and said metallic film is deposited by vacuum vapor deposition.

10. A method of forming, by means of projection exposure, an irregular surface having a depth of 15–150 nm and varying the index of refraction continuously.

11. A method of forming an irregular surface structure of optical resin varying continuously in an index of refraction for reduction of reflected light, the method comprising the steps of:

providing a substrate coated with a photoresist;

projecting light through a mask of transparent apertures onto said photoresist to produce strongly exposed areas, weakly exposed areas and unexposed areas of said photoresist;

developing said photoresist to produce concavities defined by said photoresist after development wherein deep areas of said concavities are defined by said strongly exposed areas and edges of said concavities are defined by one of said unexposed areas and weakly exposed areas, said photoresist thereby defining a first irregular surface of said substrate;

forming a mold having a second irregular surface obtained by transfer formation from said first irregular surface of said substrate; and molding said optical resin in said mold to form said irregular surface structure.

12. The method of claim 11 wherein said transparent apertures have widths and define line widths sufficient to produce said concavities at a pitch of 0.1 $\mu$m.

13. The method of claim 11 wherein said light is projected through said transparent apertures and applied onto said photoresist by reduction projection.

14. The method of claim 11 wherein said mask has said transparent apertures configured in a pattern of transparent squares.

15. The method of claim 14 wherein said transparent squares define line widths of 1 $\mu$m.

16. The method of claim 14 wherein said transparent squares are 1 $\mu$m in width.

17. The method of claim 16 wherein said light is projected through said transparent squares and applied onto said photoresist by reduction projection.

18. The method of claim 17 wherein said light is projected reduced by a factor of 10.

19. The method of claim 18 wherein said light is ultraviolet light.

20. The method of claim 19 wherein said photoresist has a thickness in the range of 0.3 to 0.5 $\mu$m.

21. The method of claim 19 wherein said concavities have a maximum depth of about 0.3 $\mu$m.

22. The method of claim 11 wherein the step forming said mold includes the steps of:

depositing a metallic film on said first irregular surface formed of said photoresist;

plating a metal layer onto said metallic film;

bonding a mold blank to said metal layer; and separating said metallic film, said metal layer and said mold blank in bonded unison from said first irregular surface formed to form said mold with the metallic film forming said second irregular surface.

23. The convex-microgranular surface structure according to claim 22 wherein said metallic film and said metal layer are nickel and said metallic film is deposited by vacuum vapor deposition.

24. A method of forming an irregular surface structure of optical resin varying continuously in an index of refraction for reduction of reflected light, the method comprising the steps of:

providing a substrate coated with a photoresist;

projecting ultraviolet light through a mask of transparent apertures onto said photoresist using reduction projection to produce strongly exposed areas, weakly exposed areas and unexposed areas of said photoresist resulting from coving of the projected ultraviolet light;

developing said photoresist to produce concavities defined by said photoresist after development wherein deep areas of said concavities are defined by said strongly exposed areas and edges of said concavities are defined by said unexposed areas, said photoresist thereby defining a first irregular surface of said substrate;

forming a mold having a second irregular surface obtained by transfer formation from said first irregular surface of said substrate; and molding said optical resin in said mold to form said irregular surface structure.

25. The method of claim 24 wherein said transparent apertures have widths and define line widths sufficient to produce, in conjunction with said reduction projection, said concavities at a pitch of 0.1 $\mu$m.

26. The method of claim 25 wherein said photoresist has a thickness in the range of 0.3 to 0.5 $\mu$m.

27. The method of claim 26 wherein said concavities have a maximum depth of about 0.3 $\mu$m.

28. The method of claim 24 wherein said photoresist has a thickness in the range of 0.3 to 0.5 $\mu$m.

29. The method of claim 24 wherein said concavities have a maximum depth of about 0.3 $\mu$m.

30. The method of claim 24 wherein the step forming said mold includes the steps of:

depositing a metallic film on said first irregular surface formed of said photoresist;

plating a metal layer onto said metallic film;

bonding a mold blank to said metal layer; and separating said metallic film, said metal layer and said mold blank in bonded unison from said first irregular surface formed to form said mold with the metallic film forming said second irregular surface.

* * * * *